United States Patent
Chi

(10) Patent No.: US 9,472,251 B2
(45) Date of Patent: Oct. 18, 2016

(54) SEMICONDUCTOR DEVICE HAVING DUMMY CELL REGION THAT ARE SYMMETRICALLY DISPOSED ABOUT PERIPHERAL REGION

(71) Applicant: SK hynix Inc., Gyeonggi-do (KR)

(72) Inventor: Sung-Soo Chi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/304,610

(22) Filed: Jun. 13, 2014

(65) Prior Publication Data
US 2015/0179239 A1 Jun. 25, 2015

(30) Foreign Application Priority Data
Dec. 20, 2013 (KR) .................. 10-2013-0160395

(51) Int. Cl.
G11C 7/00 (2006.01)
G11C 7/14 (2006.01)
G11C 5/02 (2006.01)
G11C 11/4099 (2006.01)
G11C 29/00 (2006.01)

(52) U.S. Cl.
CPC ............... *G11C 7/14* (2013.01); *G11C 5/025* (2013.01); *G11C 11/4099* (2013.01); *G11C 29/78* (2013.01)

(58) Field of Classification Search
CPC ..... G11C 7/14; G11C 11/4099; G11C 5/025; G11C 29/808; G11C 8/12; G11C 2213/71; G11C 2213/79
USPC ............... 365/200, 201, 230.03, 51, 63
See application file for complete search history.

(56) References Cited

U.S. PATENT DOCUMENTS

| 5,018,100 A * | 5/1991 | Yanagisawa | G11C 7/10 257/E27.085 |
| 6,448,602 B1 * | 9/2002 | Sakashita | G11C 5/025 257/303 |
| 6,496,441 B2 * | 12/2002 | Kono | G11C 5/025 365/189.08 |
| 8,437,208 B2 * | 5/2013 | Fujiware | 365/200 |

FOREIGN PATENT DOCUMENTS

KR 1020040038684 5/2004

* cited by examiner

*Primary Examiner* — David Lam
(74) *Attorney, Agent, or Firm* — IP & T Group LLP

(57) ABSTRACT

A semiconductor device includes a plurality of memory cell region regions with each memory cell region region having a plurality of normal memory cell regions, a dummy memory cell region disposed at one side of the plurality of normal memory cell regions, and another dummy memory cell region disposed at another side of the plurality of normal memory cell regions. The semiconductor device further includes a plurality of circuit regions, each including a control circuit to control a portion of the plurality of normal memory cell regions, the dummy memory cell region, and the other dummy memory cell region. The plurality of memory cell region regions and the plurality of control regions are symmetrically disposed about a peripheral region of the semiconductor device.

24 Claims, 15 Drawing Sheets

FIG. 1
(PRIOR ART)
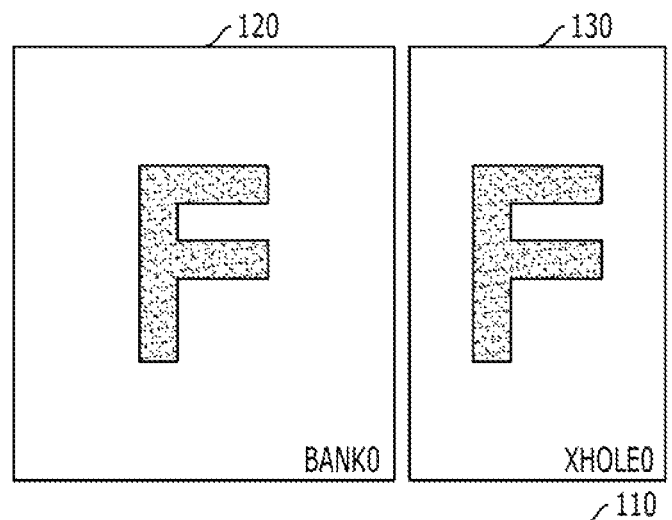
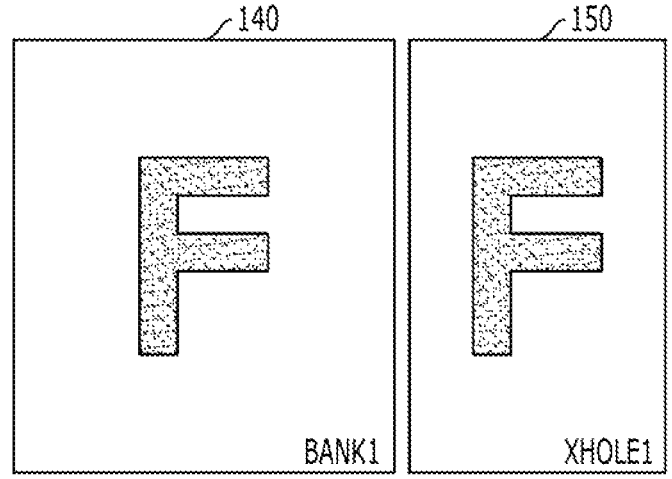

FIG. 6
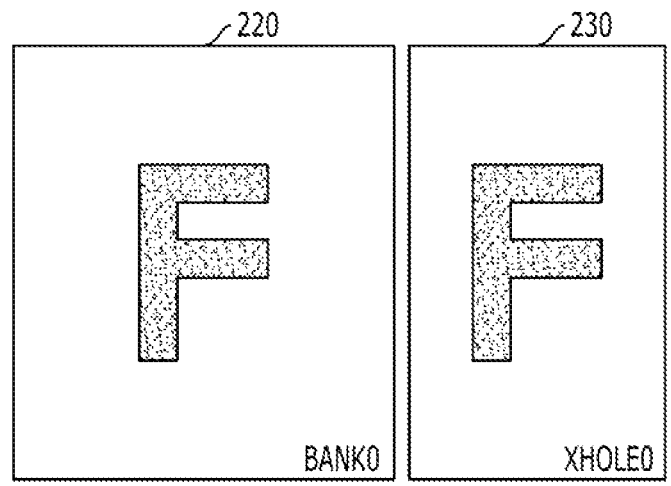
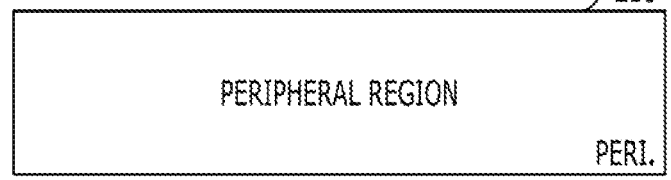
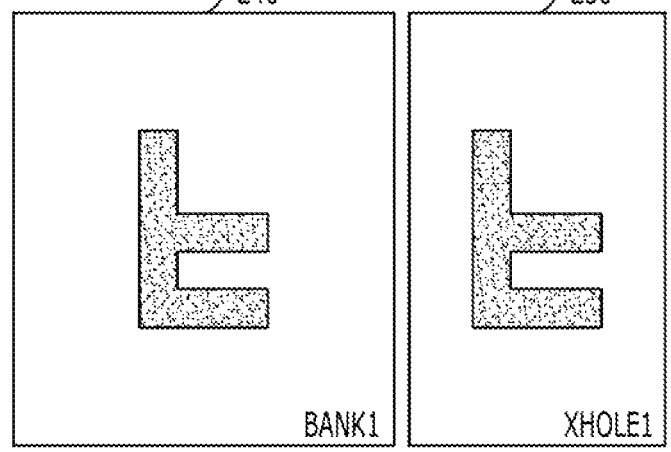

SEMICONDUCTOR DEVICE HAVING DUMMY CELL REGION THAT ARE SYMMETRICALLY DISPOSED ABOUT PERIPHERAL REGION

CROSS-REFERENCE TO RELATED APPLICATIONS

The present application claims priority of Korean Patent Application No. 10-2013-0160395, filed on Dec. 20, 2013, which is incorporated herein by reference in its entirety.

BACKGROUND

1. Field

Exemplary embodiments of the present invention relate to a semiconductor design technology, and more particularly, to a semiconductor device having a dummy region.

2. Description of the Related Art

In general, the number of internal circuits and signal lines in a semiconductor device increases with the integration degree of the semiconductor device. The internal circuits of a semiconductor device are limited to a certain amount of space. Therefore, the size of the internal circuits and the line width of the signal lines decrease as the level of integration increases. The reduction in size increases the chance that the semiconductor device may fail and serves as a factor that decreases the manufacturing yield of semiconductor devices.

For example, in a semiconductor device, such as a dynamic random access memory (DRAM), the size of a memory cell becomes smaller and the data line width becomes narrower. This results in an increase in capacity for a given area. However, there is a drawback, that is, the memory cell of the semiconductor device has an increased chance of failure as memory cell size is reduced.

A redundancy circuit is provided in the semiconductor device to compensate for the chance that a memory cell may fail. Therefore, the current yield rate of semiconductor devices is still high even given the increased probability of failure.

Generally, a semiconductor device has a redundancy circuit to compensate for a failed memory cell or a faulty line. The redundancy circuit compensates for the failure by substituting a redundancy memory cell for a failed memory cell detected during a wafer test. When the redundancy circuit receives an address corresponding to a failed memory cell, the redundancy circuit blocks the path for selection of the failed memory cell and generates a path for the selection of a redundancy memory cell. The redundancy memory cell includes a plurality of fuses for programming the addresses corresponding to the failed memory cell and also programs a plurality of fuses to compensate for the failure.

FIG. 1 is a block diagram illustrating a conventional semiconductor device.

Referring to FIG. 1, the conventional semiconductor device 100 comprises a peripheral region 110, a first memory region 120, a first circuit region 130, a second memory region 140, and a second circuit region 150. The peripheral region 110 may be coupled to an external device (not shown). The first memory region 120 may be disposed at a side of the peripheral region 110. The first circuit region 130 may be disposed at one side of the peripheral region 110 and configured to control the first memory region 120. The second memory region 140 may be disposed on another side of the peripheral region 110. The second circuit region 150 may be disposed on a third side of the peripheral region 110 and configured to control the second memory region 140. The first and second memory regions 120 and 140 may be asymmetrically disposed about the peripheral region 110, and the first and second circuit regions 130 and 150 may be asymmetrically disposed about the peripheral region 110.

The peripheral region 110 serves as a medium between internal circuits of the first and second memory regions 120 and 140, the first and second circuit regions 130 and 150, and the external device. For example, the peripheral region 110 interfaces the internal circuits of the first and second memory regions 120 and 140, the first and second circuit regions 130 and 150, and the external device for communication of data, addresses, or commands.

The internal circuits of the first and second memory regions 120 and 140, and the first and second circuit regions 130 and 150 will now be described with reference to FIGS. 2 and 3.

FIG. 2 is a block diagram illustrating the first memory region 120 and the first circuit region 130. FIG. 3 is a block diagram illustrating the second memory region 140 and the second circuit region 150. It is noted that FIGS. 2 and 3 show an arrangement for blocking the path for selection of a failed memory cell.

Referring to FIG. 2, the first memory region 120 may include an open bit line structure including a plurality of normal memory cell regions UM00 to UM09 and DM00 to DM08 and first and second dummy memory cell regions DM09 and DM09'.

The first dummy memory cell region DM09, the ninth to first lower normal memory cell regions DM08 to DM00, the tenth to first upper normal memory cell regions UM09 to UM00, and the second dummy memory cell region DM09' are sequentially disposed about the peripheral region 110. That is, in the column direction, the first to tenth upper normal memory cell regions UM00 to UM09 and the first to ninth lower normal memory cell regions DM00 to DM08 are serially disposed, the first dummy memory cell region DM09 is disposed under the lower normal memory cell region DM08 and the second dummy memory cell region DM09' is disposed over the first upper normal memory cell region UM00.

The first and second dummy memory cell regions DM09 and DM09' may serve as a normal memory cell region or a tenth lower normal memory cell region according to control of the peripheral region 110. That is, the first dummy memory cell region DM09 may serve as a half of the tenth lower normal memory cell region and the second dummy memory cell region DM09' may serve as the other half of the tenth lower normal memory cell region. Consequently, the first memory region 120 may include the first to tenth normal memory cell regions UM00 to UM09 and the first to tenth lower normal memory cell regions DM00 to DM09 and DM09'.

Hereinafter, the group of the first to tenth upper normal memory cell regions UM00 to UM09 is referred to as a first upper memory cell region group UMG0, and the group of the first to tenth lower normal memory cell regions DM00 to DM09 and DM09' is referred to as a first lower memory cell region group DMG0. The term of the first to tenth upper normal memory cell regions UM00 to UM09 or the first upper memory cell region group UMG0 will be selectively used when necessary. Also, the term of the first to tenth lower normal memory cell regions DM00 to DM09 and DM09' or the first lower memory cell region group DMG0 will be selectively used when necessary.

According to the open bit line structure, a plurality of bit line sense amplifiers may be disposed between the memory cell regions. A sense amplifier for a bit line may be disposed at a side of the memory cell region and a sense amplifier for a bit line bar may be disposed at the other side of the memory cell region. Each of the bit line sense amplifiers senses and amplifies data on a bit line and a bit line bar, each of which is coupled to different memory cell regions. According to the open bit line structure which is different from a folded bit line structure in which a bit line and a bit line bar are coupled to the same memory cell region, the first and second dummy memory cell regions DM09 and DM09' should be disposed on both sides.

Referring back to FIG. 2, the first circuit region 130 may include first to tenth upper memory cell region selection units UBS00 to UBS09, a first upper memory cell region control unit UFS00 to USF09 and URED0, a first to eleventh lower memory cell region selection units DBS00 to DBS09 and DBS09' and a first lower memory cell region control unit DFS00 to DFS09 and DRED0.

The first to tenth upper memory cell region selection units UBS00 to UBS09 correspond to the first to tenth upper normal memory cell regions UM00 to UM09 of the first upper memory cell region group UMG0, respectively. The first upper memory cell region control unit UFS00 to USF09 and URED0 controls the first to tenth upper memory cell region selection units UBS00 to UBS09 in response to a first row address BXAR0. The first to eleventh lower memory cell region selection units DBS00 to DBS09 and DBS09' correspond to the first to tenth lower normal memory cell regions DM00 to DM09 and DM09' of the first lower memory cell region group DMG0, respectively. The first lower memory cell region control unit DFS00 to DFS09 and DRED0 controls the first to eleventh lower memory cell region selection units DBS00 to DBS09 and DBS09' in response to the first row address BXAR0.

The first upper memory cell region control unit UFS00 to USF09 and URED0 may include first to tenth upper comparison units UFS00 to UFS09 and a first upper repair unit URED0.

The first to tenth upper comparison units UFS00 to UFS09 correspond to the first to tenth upper memory cell region selection units UBS00 to UBS09, respectively. The first to tenth upper comparison units UFS00 to UFS09 compare the first row address BXAR0 and each of pre-stored comparison addresses (not shown) and generate first to tenth upper redundancy pre-signals UXHITB00 to UXHITB09. The first upper repair unit URED0 generates an upper redundancy operation signal UNXEB0 in response to the first to tenth upper redundancy pre-signals UXHITB00 to UXHITB09.

For example, if the first row address BXAR0 and one of pre-stored comparison addresses are identical, then the first to tenth upper comparison units UFS00 to UFS09 enable a corresponding pre-signal of the first to tenth upper redundancy pre-signals UXHITB00 to UXHITB09. The first upper repair unit URED0 disables the first to tenth upper memory cell region selection units UBS00 to UBS09 by enabling the upper redundancy operation signal UNXEB0 if one or more of the first to tenth upper redundancy pre-signals UXHITB00 to UXHITB09 are enabled. The disabled first to tenth upper memory cell region selection units UBS00 to UBS09 do not select the first to tenth upper normal memory cell regions UM00 to UM09 of the first upper memory cell region group UMG0 regardless of any signal (not shown) for selecting the first to tenth upper normal memory cell regions UM00 to UM09 of the first upper memory cell region group UMG0.

The first lower memory cell region control unit DFS00 to DFS09 and DRED0 may include first to tenth lower comparison units DFS00 to DFS09 and a first lower repair unit DRED0.

The first to tenth lower comparison units DFS00 to DFS09 correspond to the first to tenth lower memory cell region selection units DBS00 to DBS09, respectively. The first to tenth lower comparison units DFS00 to DFS09 compare the first row address BXAR0 and each of pre-stored comparison addresses (not shown) and generate first to tenth lower redundancy pre-signals DXHITB00 to DXHITB09. The first lower repair unit DRED0 generates a lower redundancy operation signal DNXEB0 in response to the first to tenth lower redundancy pre-signals DXHITB00 to DXHITB09.

For example, if the first row address BXAR0 and one of pre-stored comparison addresses are identical, then the first to tenth lower comparison units DFS00 to DFS09 enable corresponding first to tenth lower redundancy pre-signals DXHITB00 to DXHITB09. The first lower repair unit DRED0 disables the first to eleventh lower memory cell region selection units DBS00 to DBS09 and DBS09' by enabling the lower redundancy operation signal DNXEB0 if one or more of the first to tenth lower redundancy pre-signals DXHITB00 to DXHITB09 are enabled. The disabled first to eleventh lower memory cell region selection units DBS00 to DBS09 and DBS09' do not select the first to tenth lower normal memory cell regions DM00 to DM09 and DM09' of the first lower memory cell region group DMG0 regardless of any signal (not shown) for selecting the first to tenth lower normal memory cell regions DM00 to DM09 and DM09' of the first lower memory cell region group DMG0.

Referring to FIG. 3, the second memory region 140 may include a plurality of normal memory cell regions UM10 to UM19 and DM10 to DM18 and first and second dummy memory cell regions DM19 and DM19' according to the open bit line structure.

The second dummy memory cell region DM19', the first to tenth upper normal memory cell regions UM10 to UM19, the first to ninth lower normal memory cell regions DM10 to DM18, and the first dummy memory cell region DM09 may be sequentially disposed about the peripheral region 110. That is, in the column direction, the first to tenth upper normal memory cell regions UM10 to UM19 and the first to ninth lower normal memory cell regions DM10 to DM18 are serially disposed, the first dummy memory cell region DM19 is disposed under the lower normal memory cell region DM18 and the second dummy memory cell region DM19' is dispose over the first upper normal memory cell region UM10.

The first and second dummy memory cell regions DM19 and DM19' may serve as a normal memory cell region or a tenth lower normal memory cell region according to control of the peripheral region 110. That is, the first dummy memory cell region DM19 may serve as a half of the tenth lower normal memory cell region and the second dummy memory cell region DM19' may serve as the other half of the tenth lower normal memory cell region. Consequently, the second memory region 140 may include the first to tenth normal memory cell regions UM10 to UM19 and the first to tenth lower normal memory cell regions DM10 to DM19 and DM19'.

The group of the first to tenth upper normal memory cell regions UM10 to UM19 is referred to as a second upper memory cell region group UMG1, and the group of the first to tenth lower normal memory cell regions DM10 to DM19 and DM19' is referred to as a second lower memory cell region group DMG1. The term of the first to tenth upper normal memory cell regions UM10 to UM19 or the second upper memory cell region group UMG1 will be selectively used when necessary. Also, appropriate indication between the first to tenth lower normal memory cell regions DM10 to DM19 and DM19' and the second lower memory cell region group DMG1 will be used when necessary.

The second circuit region 150 may include first to tenth upper memory cell region selection units UBS10 to UBS19, a second upper memory cell region control unit UFS10 to USF 19 and URED1, a first to eleventh lower memory cell region selection units DBS10 to DBS19 and DBS19' and a second lower memory cell region control unit DFS10 to DFS19 and DRED1.

The first to tenth upper memory cell region selection units UBS10 to UBS19 correspond to the first to tenth upper normal memory cell regions UM10 to UM19 of the second upper memory cell region group UMG1, respectively. The second upper memory cell region control unit UFS10 to USF19 and URED1 controls the first to tenth upper memory cell region selection units UBS10 to UBS19 in response to a second row address BXAR1. The first to eleventh lower memory cell region selection units DBS10 to DBS19 and DBS19' correspond to the first to tenth lower normal memory cell regions DM10 to DM19 and DM19' of the second lower memory cell region group DMG1, respectively. The second lower memory cell region control unit DFS10 to DFS19 and DRED1 controls the first to eleventh lower memory cell region selection units DBS10 to DBS19 and DBS19' in response to the second row address BXAR1.

The second upper memory cell region control unit UFS10 to USF19 and URED1 may include first to tenth upper comparison units UFS10 to UFS19 and a second upper repair unit URED1.

The first to tenth upper comparison units UFS10 to UFS19 correspond to the first to tenth upper memory cell region selection units UBS10 to UBS19, respectively. The first to tenth upper comparison units UFS10 to UFS19 compare the second row address BXAR1 and each of pre-stored comparison addresses (not shown) and generate first to tenth upper redundancy pre-signals UXHITB10 to UXHITB19. The second upper repair unit URED1 generates an upper redundancy operation signal UNXEB1 in response to the first to tenth upper redundancy pre-signals UXHITB10 to UXHITB19.

For example, if the second row address BXAR1 and one of pre-stored comparison addresses are identical, then the first to tenth upper comparison units UFS10 to UFS19 enable corresponding first to tenth upper redundancy pre-signals UXHITB10 to UXHITB19. The second upper repair unit URED1 disables the first to tenth upper memory cell region selection units UBS10 to UBS19 by enabling the upper redundancy operation signal UNXEB1 if one or more of the first to tenth upper redundancy pre-signals UXHITB10 to UXHITB19 are enabled. The disabled first to tenth upper memory cell region selection units UBS10 to UBS19 do not select the first to tenth upper normal memory cell regions UM10 to UM19 of the second upper memory cell region group UMG1 regardless of any signal (not shown) for selecting the first to tenth upper normal memory cell regions UM10 to UM19 of the second upper memory cell region group UMG1.

The second lower memory cell region control unit DFS10 to DFS19 and DRED1 includes first to tenth lower comparison units DFS10 to DFS19 and a second lower repair unit DRED1.

The first to tenth lower comparison units DFS10 to DFS19 correspond to the first to tenth lower memory cell region selection units DBS10 to DBS19, respectively. The first to tenth lower comparison units DFS10 to DFS19 compare the second row address BXAR1 and each of pre-stored comparison addresses (not shown) and generate first to tenth lower redundancy pre-signals DXHITB10 to DXHITB19. The second lower repair unit DRED1 generates a lower redundancy operation signal DNXEB1 in response to the first to tenth lower redundancy pre-signals DXHITB10 to DXHITB19.

For example, if the second row address BXAR1 and one of pre-stored comparison addresses are identical, then the first to tenth lower comparison units DFS10 to DFS19 enable corresponding first to tenth lower redundancy pre-signals DXHITB10 to DXHITB19. The second lower repair unit DRED1 disables the first to eleventh lower memory cell region selection units DBS10 to DBS19 and DBS19' by enabling the lower redundancy operation signal DNXEB1 if one or more of the first to tenth lower redundancy pre-signals DXHITB10 to DXHITB19 are enabled. The disabled first to eleventh lower memory cell region selection units DBS10 to DBS19 and DBS19' do not select the first to tenth lower normal memory cell regions DM10 to DM19 and DM19' of the second lower memory cell region group DMG1 regardless of any signal (not shown) for selecting the first to tenth lower normal memory cell regions DM10 to DM19 and DM19' of the second lower memory cell region group DMG1.

The operation of a conventional semiconductor device 100 will now be described.

Operation of the first circuit region 130 is as follows.

If the first row address BXAR0 is input with a write command or a read command, then the first upper memory cell region control unit UFS00 to USF09 and URED0 and the first lower memory cell region control unit DFS00 to DSF09 and DRED0 determine whether or not to enable the upper redundancy operation signal UNXEB0 based on whether or not the first row address BXAR0 corresponds to a failed memory cell.

For example, the first to tenth upper comparison units UFS00 to UFS09 compare the first row address BXAR0 to each of the pre-stored comparison addresses and generate the first to tenth upper redundancy pre-signals UXHITB00 to UXHITB09. The first upper repair unit URED0 enables the upper redundancy operation signal UNXEB0 if one or more of the first to tenth upper redundancy pre-signals UXHITB00 to UXHITB09 are enabled. The first to tenth lower comparison units DFS00 to DFS09 compare the first row address BXAR0 and each of the pre-stored comparison addresses and generate the first to tenth lower redundancy pre-signals DXHITB00 to DXHITB09. The first lower repair unit DRED0 enables the lower redundancy operation signal DNXEB0 if one or more of the first to tenth lower redundancy pre-signals DXHITB00 to DXHITB09 are enabled.

Enablement of the first to tenth upper memory cell region selection units UBS00 to UBS09 depends on the upper redundancy operation signal UNXEB0.

For example, the first to tenth upper memory cell region selection units UBS00 to UBS09 do not select the first to tenth upper normal memory cell regions UM00 to UM09 of the first upper memory cell region group UMG0, regardless of any signal for selecting the first to tenth upper normal memory cell regions UM00 to UM09 of the first upper memory cell region group UMG0, if the upper redundancy operation signal UNXEB0 is enabled. This is to prevent selection of a failed memory cell. On the other hand, the first to tenth upper memory cell region selection units UBS00 to UBS09 select one or more of the first to tenth upper normal memory cell regions UM00 to UM09 of the first upper memory cell region group UMG0 according to a signal for selecting the first to tenth upper normal memory cell regions UM00 to UM09 of the first upper memory cell region group UMG0 if the upper redundancy operation signal UNXEB0 is disabled.

Enablement of the first to eleventh lower memory cell region selection units DBS00 to DBS09 and DBS09' depends on the lower redundancy operation signal DNXEB0.

For example, the first to eleventh lower memory cell region selection units DBS00 to DBS09 and DBS09' do not select the first to tenth lower normal memory cell regions DM00 to DM09 and DM09' of the first lower memory cell region group DMG0, regardless of any signal for selecting the first to tenth lower normal memory cell regions DM00 to DM09 and DM09' of the first lower memory cell region group DMG0, if the lower redundancy operation signal DNXEB0 is enabled. This is to prevent selection of a failed memory cell. On the other hand, the first to eleventh lower memory cell region selection units DBS00 to DBS09 and DBS09' select one or more of the first to tenth lower normal memory cell regions DM00 to DM09 and DM09' of the first lower memory cell region group DMG0 according to a signal for selecting the first to tenth lower normal memory cell regions DM00 to DM09 and DM09' of the first lower memory cell region group DMG0, if the lower redundancy operation signal DNXEB0 is disabled.

Operation of the second circuit region 150 is as follows.

If the second row address BXAR1 is input with a write command or a read command, then the second upper memory cell region control unit UFS10 to USF19 and URED1 and the second lower memory cell region control unit DFS10 to DSF19 and DRED1 determine whether to enable the upper redundancy operation signal UNXEB1 based on whether the second row address BXAR1 corresponds to a failed memory cell.

For example, the first to tenth upper comparison units UFS10 to UFS19 compare the second row address BXAR1 to each of the pre-stored comparison addresses and generate the first to tenth upper redundancy pre-signals UXHITB10 to UXHITB19. The second upper repair unit URED1 enables the upper redundancy operation signal UNXEB1 if one or more of the first to tenth upper redundancy pre-signals UXHITB00 to UXHITB09 are enabled. The first to tenth lower comparison units DFS10 to DFS19 compare the second row address BXAR1 to each of the pre-stored comparison addresses and generate the first to tenth lower redundancy pre-signals DXHITB10 to DXHITB19. The second lower repair unit DRED1 enables the lower redundancy operation signal DNXEB1 if one or more of the first to tenth lower redundancy pre-signals DXHITB10 to DXHITB19 are enabled.

Enablement of the first to tenth upper memory cell region selection units UBS10 to UBS19 depends on the upper redundancy operation signal UNXEB1.

For example, the first to tenth upper memory cell region selection units UBS10 to UBS19 do not select the first to tenth upper normal memory cell regions UM10 to UM19 of the second upper memory cell region group UMG1, regardless of any signal for selecting the first to tenth upper normal memory cell regions UM10 to UM19 of the second upper memory cell region group UMG1, if the upper redundancy operation signal UNXEB1 is enabled. This is to prevent selection of a failed memory cell. On the other hand, the first to tenth upper memory cell region selection units UBS10 to UBS19 select one or more of the first to tenth upper normal memory cell regions UM10 to UM19 of the second upper memory cell region group UMG1 according to a signal for selecting the first to tenth upper normal memory cell regions UM10 to UM19 of the second upper memory cell region group UMG1, if the upper redundancy operation signal UNXEB1 is disabled.

Enablement of the first to eleventh lower memory cell region selection units DBS10 to DBS19 and DBS19' depends on the lower redundancy operation signal DNXEB1.

For example, the first to eleventh lower memory cell region selection units DBS10 to DBS19 and DBS19' do not select the first to tenth lower normal memory cell regions DM10 to DM19 and DM19' of the second lower memory cell region group DMG1 regardless of any signal for selecting the first to tenth lower normal memory cell regions DM10 to DM19 and DM19' of the second lower memory cell region group DMG1 if the lower redundancy operation signal DNXEB1 is enabled. This is to prevent selection of a failed memory cell. On the other hand, the first to eleventh lower memory cell region selection units DBS10 to DBS19 and DBS19' select one or more of the first to tenth lower normal memory cell regions DM10 to DM19 and DM19' of the second lower memory cell region group DMG1 according to a signal for selecting the first to tenth lower normal memory cell regions DM10 to DM19 and DM19' of the second lower memory cell region group DMG1, if the lower redundancy operation signal DNXEB1 is disabled.

The conventional semiconductor device 100 has the following problem.

The first circuit region 130 blocks a path for selection of the first memory region 120 when the first row address BXAR0, corresponding to a failed memory cell, is input. The second circuit region 150 blocks a path for selection of the second memory region 140 when the second row address BXAR1, corresponding to a failed memory cell, is input. Given this case, a time point when the second circuit region 150 blocks the path for selection of the second memory region 140 is later than the time point when the first circuit region 130 blocks the path for selection of the first memory region 120. The problem is described hereinafter with reference to FIGS. 4 and 5.

FIG. 4 is a block diagram illustrating the longest path in the first circuit region 130, from the start of transmission of the first row address BXAR0 to completion of transmission of the lower redundancy operation signal DNXEB0.

FIG. 5 is a block diagram illustrating the longest path in the second circuit region 150, from the start of transmission of the second row address BXAR1 to completion of transmission of the lower redundancy operation signal DNXEB1.

Referring to FIG. 4, the longest path in the first circuit region 130 corresponds to where the first row address BXAR0 is identical to the pre-stored comparison address stored in the first lower comparison unit DFS00 and the eleventh lower memory cell region selection unit DBS09' is disabled according to the lower redundancy operation signal DNXEB0. In this case, the longest path in the first circuit region 130 is sum of paths for transmission of the first row address BXAR0 (2K[μm]), the first lower redundancy free signal DXHITB00 (1K[μm]) and the lower redundancy operation signal DNXEB0 (3K[μm]), which corresponds to 6K[μm].

On the other hand, referring to FIG. 5, the longest path in the second circuit region 150 corresponds to where the second row address BXAR1 is identical to the pre-stored comparison address stored in the tenth lower comparison unit DFS19 and the eleventh lower memory cell region selection unit DBS19' is disabled according to the lower redundancy operation signal DNXEB1. In this case, the longest path in the second circuit region 150 is sum of paths for transmission of the second row address BXAR1 (4K [μm]), the tenth lower redundancy free signal DXHITB19 (1K[μm]) and the lower redundancy operation signal DNXEB1 (3K[μm]), which corresponds to 8K[μm].

As described above, the longest path in the second circuit region 150 is longer than the longest path in the first circuit region 130. This is because the first and second circuit regions 130 and 150 are disposed asymmetrically about the peripheral region 110 and thus the second circuit region 150 has a longer path than the first circuit region 130.

The discrepancy that occurs at the time point when the second circuit region 150 blocks the path for selection of the second memory region 140 is later than the time point when the first circuit region 130 blocks the path for selection of the first memory region 120 and this causes deterioration of timing parameters of the semiconductor device.

SUMMARY

Various exemplary embodiments of the present invention are directed to a semiconductor device having a disposition structure with minimized backward path.

In accordance with an exemplary embodiment of the present invention, a semiconductor device may include: a first memory cell region region including a plurality of first normal memory cell regions, a first dummy memory cell region disposed at one side of the plurality of first normal memory cell regions, and a second dummy memory cell region disposed at another side of the plurality of first normal memory cell regions; a first circuit region including a first control circuit to control an operation of the plurality of first normal memory cell regions, the first dummy memory cell region, and the second dummy memory cell region in response to a first source signal; a second memory cell region region including a plurality of second normal memory cell regions, a third dummy memory cell region disposed at the one side of the plurality of second normal memory cell regions, and a fourth dummy memory cell region disposed at the another side of the plurality of second normal memory cell regions; and a second circuit region including a second control circuit to control an operation of the plurality of second normal memory cell regions, the third dummy memory cell region, and the fourth dummy memory cell region in response to a second source signal, wherein the first memory cell region region and the second memory cell region region are symmetrically disposed about a peripheral region of the semiconductor device and the first circuit region and the second circuit region are symmetrically disposed about the peripheral region of the semiconductor device.

In accordance with an exemplary embodiment of the present invention, a semiconductor device may include: a first memory cell region region including in serial order a first dummy memory cell region, a plurality of first normal memory cell regions and a second dummy memory cell region; a first circuit region including a first dummy memory cell region selection unit to select the first dummy memory cell region, a second dummy memory cell region selection unit to select the second dummy memory cell region, and a first memory cell region control unit to prevent the first dummy memory cell region selection unit and the second dummy memory cell region selection unit from respectively selecting the first dummy memory cell region or the second dummy memory cell region in response to a first source signal; a second memory cell region region including, in serial order a third dummy memory cell region, a plurality of second normal memory cell regions and a fourth dummy memory cell region; and a second circuit region including a third dummy memory cell region selection unit to select the third dummy memory cell region, a fourth dummy memory cell region selection unit to select the fourth dummy memory cell region, and a second memory cell region control unit to prevent the third dummy memory cell region selection unit and the fourth dummy memory cell region selection unit from respectively selecting the third dummy memory cell region or the fourth dummy memory cell region in response to a second source signal, wherein an input path and an output path of the first memory cell region control unit and the second memory cell region control unit are symmetrically disposed about a peripheral region of the semiconductor device.

In accordance with exemplary embodiments of the present invention, the semiconductor has a disposition structure with minimized backward path and thus may improve timing parameters, for example tRCD, thereof.

BRIEF DESCRIPTION OF THE DRAWINGS

FIG. 1 is a block diagram illustrating a conventional semiconductor device.

FIG. 6 is a block diagram illustrating a semiconductor device in accordance with an exemplary embodiment of the present invention.

DETAILED DESCRIPTION

Figure 2:
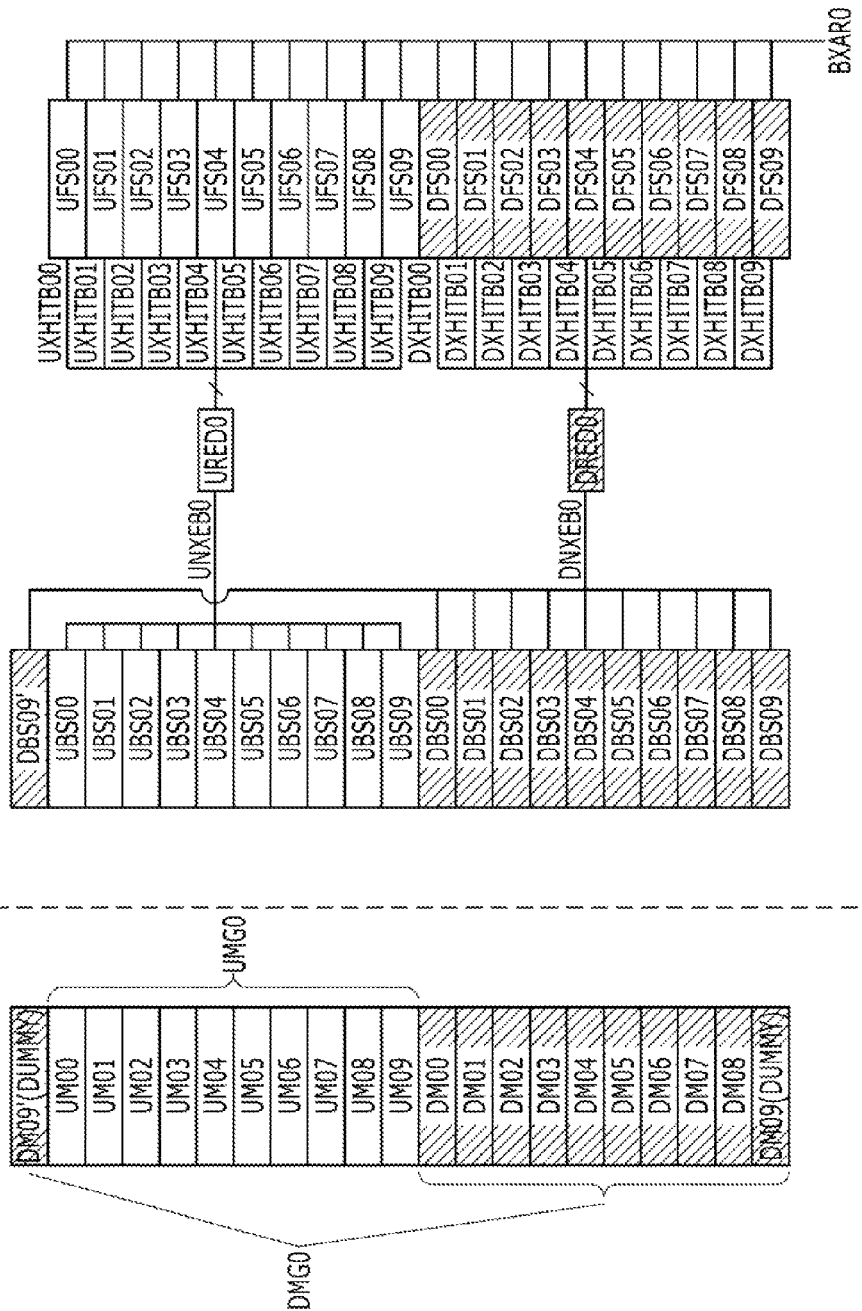
FIG. 2 is a block diagram illustrating a first memory region and a first circuit region of a conventional semiconductor device shown in FIG. 1.
Figure 3:
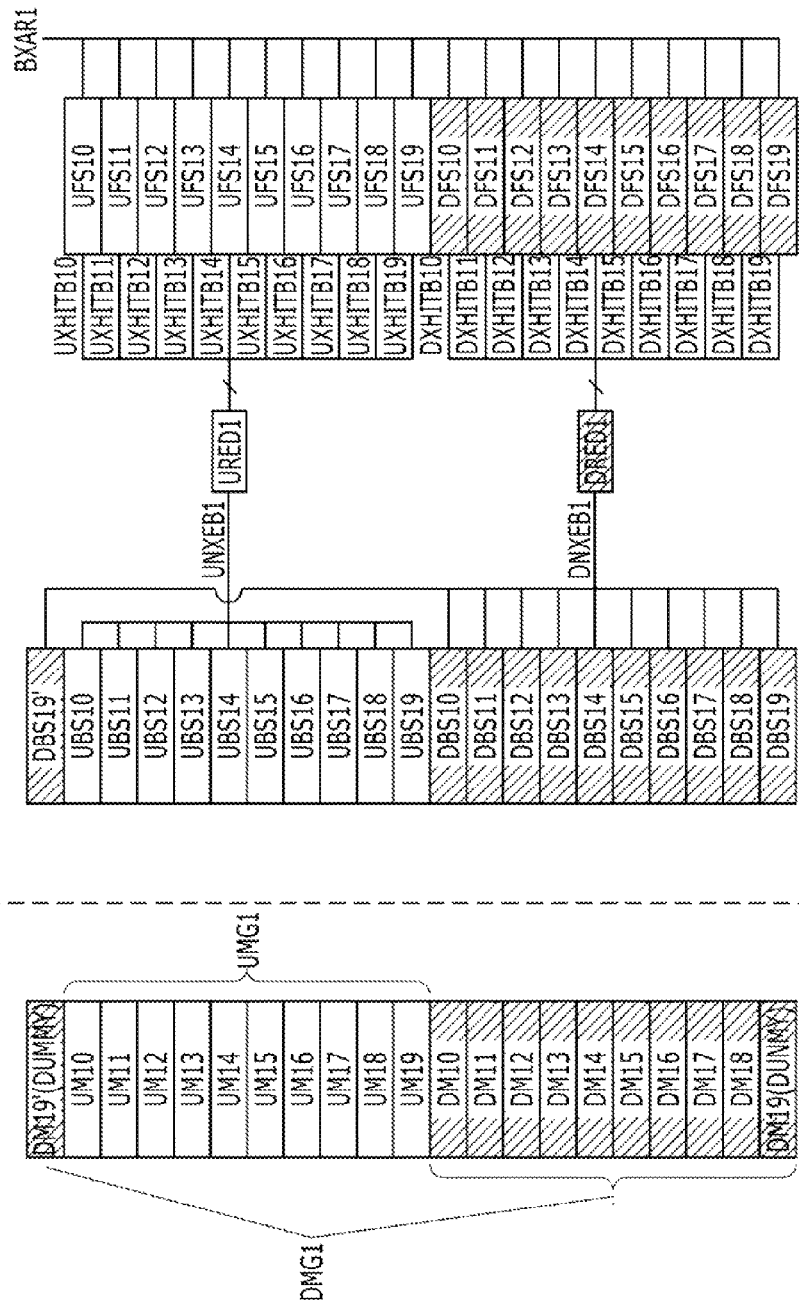
FIG. 3 is a block diagram illustrating a second memory region and a second circuit region of a conventional semiconductor device shown in FIG. 1.
Figure 4:
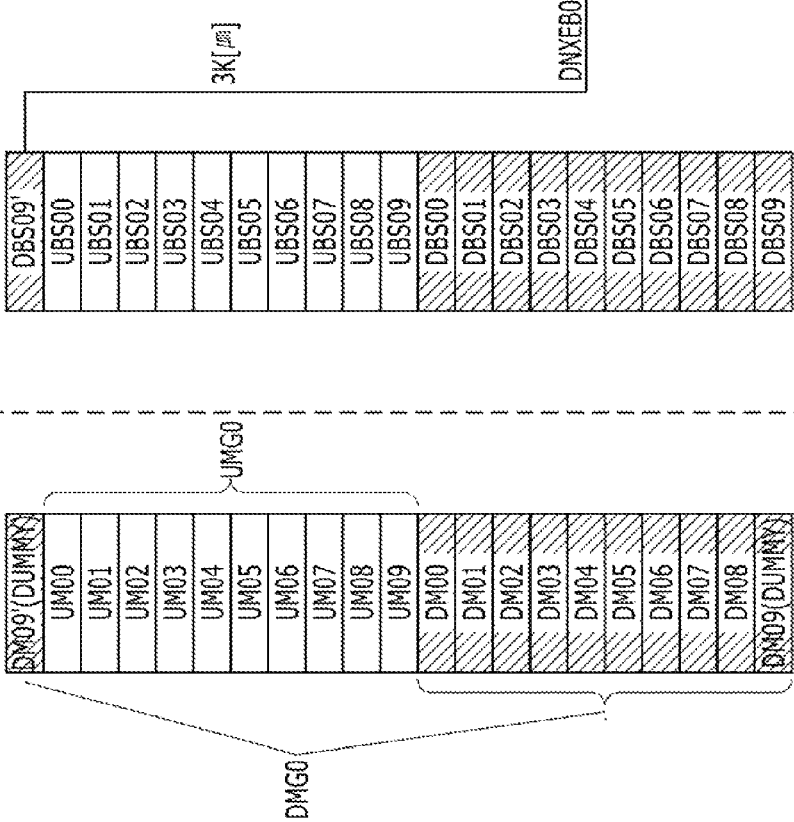
FIG. 4 is a block diagram illustrating the longest path in the first circuit region shown in FIG. 2.
Figure 5:
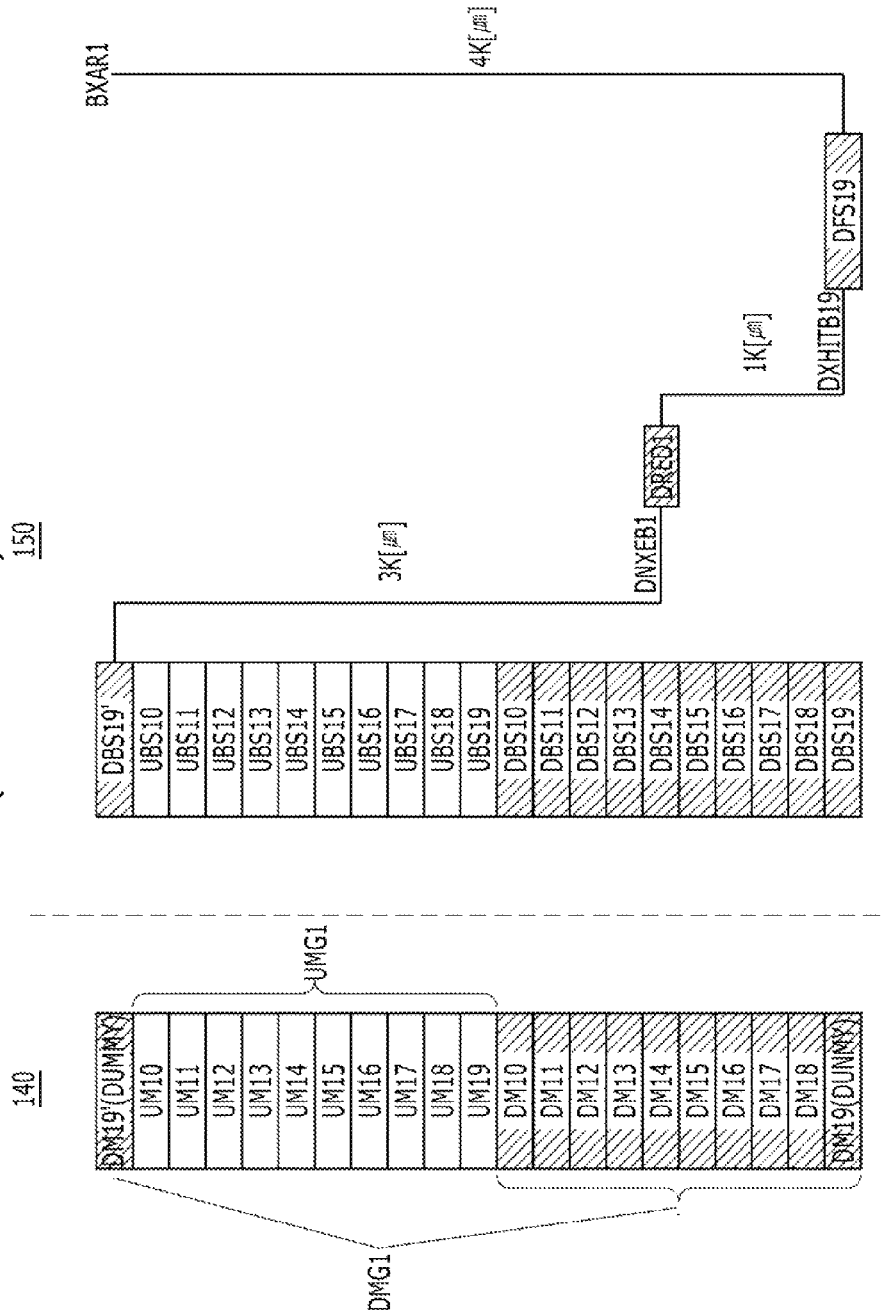
FIG. 5 is a block diagram illustrating the longest path in the second circuit region shown in FIG. 3.

Various exemplary embodiments will be described below in more detail with reference to the accompanying drawings.

The present invention may, however, be embodied in different forms and should not be construed as limited to the exemplary embodiments set forth herein. Rather, these exemplary embodiments are provided so that this disclosure will be thorough and complete and will fully convey the scope of the present invention to those skilled in the art. The drawings are not necessarily to scale and in some instances proportions may have been exaggerated in order to clearly illustrate features of the exemplary embodiments. Throughout the disclosure, reference numerals correspond directly to the like parts in the various figures and exemplary embodiments of the present invention. It should be understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. It is also noted that in this specification, "connected/coupled" refers to one component not only directly coupling another component but also indirectly coupling another component through an intermediate component. In addition, a singular form may include a plural form as long as it is not specifically mentioned in a sentence.

In the description, the DRAM is used as an example semiconductor device.

FIG. 6 is a block diagram illustrating a semiconductor device in accordance with an exemplary embodiment of the present invention.

Referring to FIG. 6, the semiconductor device 200 may comprise a peripheral region 210, a first memory region 220, a first circuit region 230, a second memory region 240 and a second circuit region 250. The peripheral region 210 may be coupled to an external device (not shown). The first memory region 220 may be disposed at a side of the peripheral region 210. The first circuit region 130 may be disposed at a side of the peripheral region 210 and configured to control the first memory region 220. The second memory region 240 may be disposed at the other side of the peripheral region 210. The second circuit region 250 may be disposed at the other side of the peripheral region 210 and configured to control the second memory region 240. The first and second memory regions 220 and 240 may be symmetrically disposed about the peripheral region 210, and the first and second circuit regions 230 and 250 may be symmetrically disposed about the peripheral region 210.

It is noted that in this embodiment of the present invention, "symmetrical disposition/structure" may refer to logical disposition sequence and the physical input and output path of the elements, as well as internal and physical arrangement of the elements, when appropriate.

The peripheral region 210 may serve as a medium between internal circuits of the first and second memory regions 220 and 240, the first and second circuit regions 230 and 250, and the external device.

For example, the peripheral region 210 may interface the internal circuits of the first and second memory regions 220 and 240, the first and second circuit regions 230 and 250, and the external device for communication of data, an address, and a command.

The internal circuits of the first and second memory regions 220 and 240, the first and second circuit regions 230 and 250 will now be described with reference to FIGS. 7 and 8.

Figure 7:
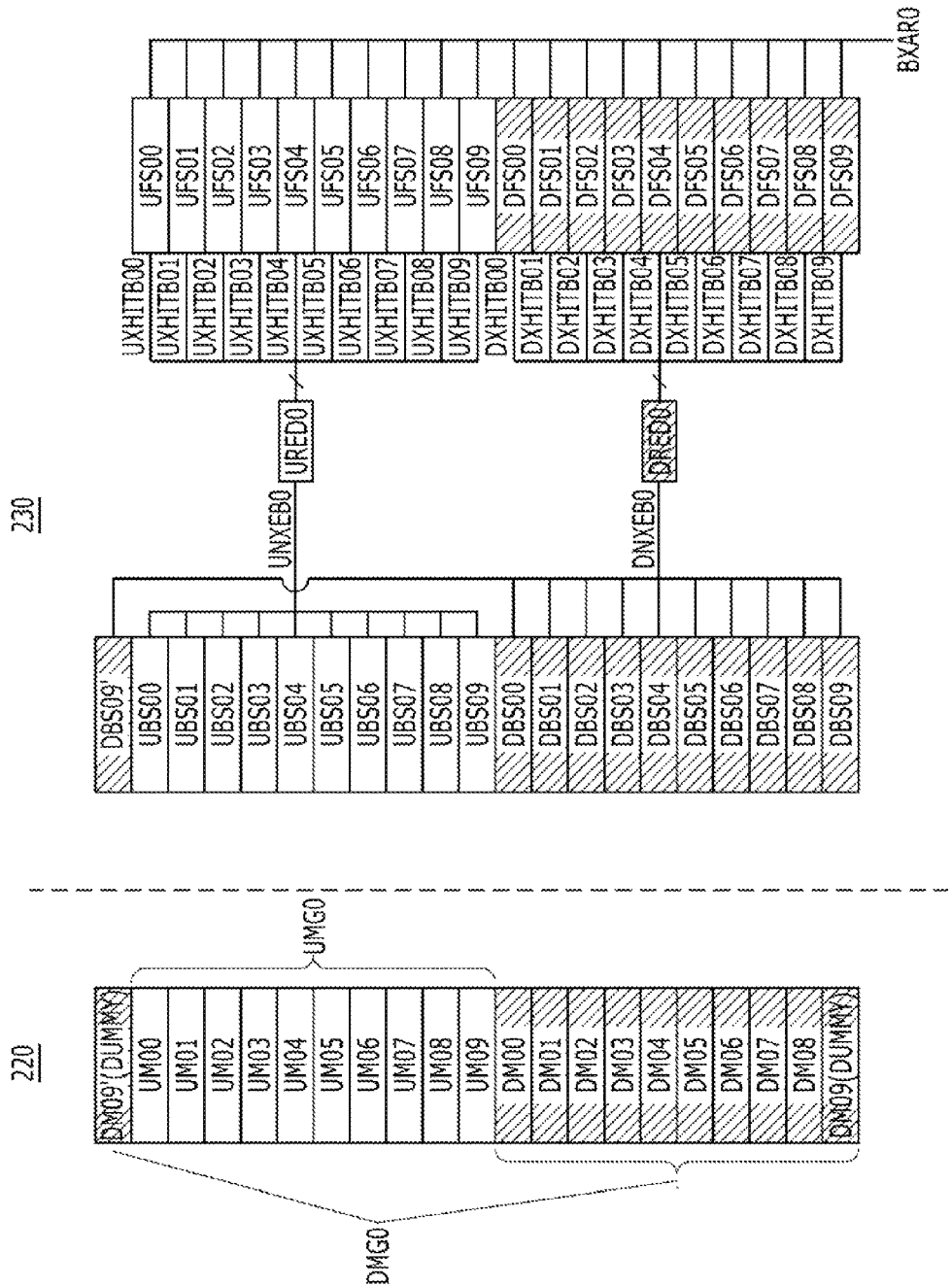
FIG. 7 is a block diagram illustrating a first memory region and a first circuit region of the exemplary semiconductor device shown in FIG. 6.

FIG. 7 is a block diagram illustrating the first memory region 220 and the first circuit region 230, as shown in FIG. 6. FIG. 8 is a block diagram illustrating the second memory region 240 and the second circuit region 250 as shown in FIG. 6.

Figure 8:
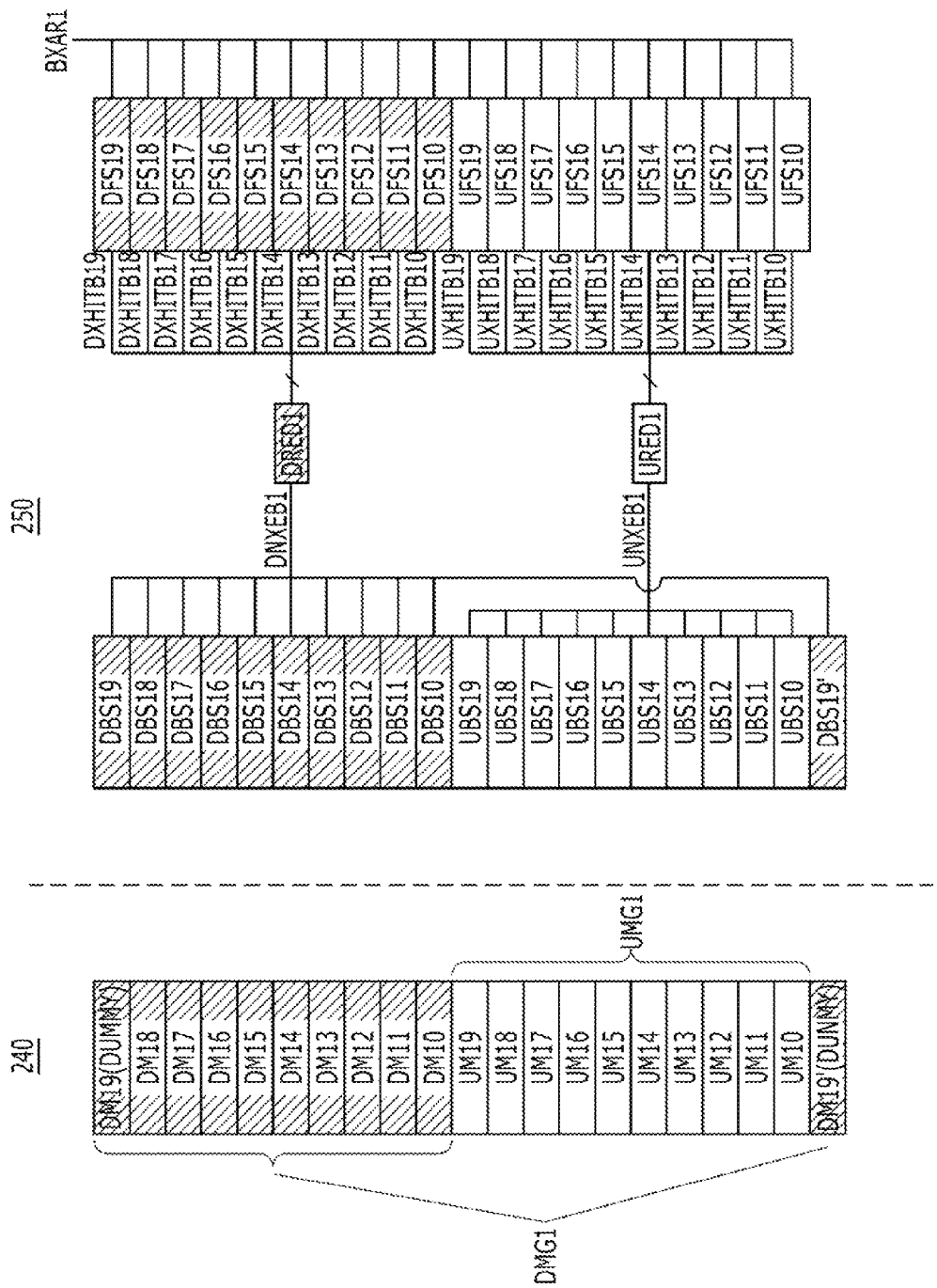
FIG. 8 is a block diagram illustrating a second memory region and a second circuit region of an exemplary semiconductor device.

It is noted that the first circuit region 230 of FIG. 7 only shows an arrangement for blocking the path for selection of the first memory region 220, and the second circuit region 250 of FIG. 8 only shows an arrangement for blocking the path for selection of the second memory region 240.

Referring to FIG. 7, the first memory region 220 may include a plurality of normal memory cell regions UM00 to UM09 and DM00 to DM08, and first and second dummy memory cell regions DM09 and DM09', according to the open bit line structure.

The first dummy memory cell region DM09, the ninth to first lower normal memory cell regions DM08 to DM00, the tenth to first upper normal memory cell regions UM09 to UM00, and the second dummy memory cell region DM09' may be sequentially disposed about the peripheral region 110. That is, in the column direction, the first to tenth upper normal memory cell regions UM00 to UM09 and the first to ninth lower normal memory cell regions DM00 to DM08 may be serially disposed. The first dummy memory cell region DM09 may be disposed under the lower normal memory cell region DM08 and the second dummy memory cell region DM09' may be disposed over the first upper normal memory cell region UM00.

The first and second dummy memory cell regions DM09 and DM09' may serve as a normal memory cell region or a tenth lower normal memory cell region according to control of the peripheral region 210. That is, the first dummy memory cell region DM09 may serve as half of the tenth lower normal memory cell region and the second dummy memory cell region DM09' may serve as the other half of the tenth lower normal memory cell region. Consequently, the first memory region 220 may include the first to tenth normal memory cell regions UM00 to UM09 and the first to tenth lower normal memory cell regions DM00 to DM09 and DM09'.

The group of the first to tenth upper normal memory cell regions UM00 to UM09 may also be referred to as a first upper memory cell region group UMG0, and the group of the first to tenth lower normal memory cell regions DM00 to DM09 and DM09' may be referred to as a first lower memory cell region group DMG0. The term of the first to tenth upper normal memory cell regions UM00 to UM09 or the first upper memory cell region group UMG0 will be selectively used when necessary. Also, the term of the first to tenth lower normal memory cell regions DM00 to DM09 and DM09' or the first lower memory cell region group DMG0 will be selectively used when necessary.

According to the open bit line structure, a plurality of bit line sense amplifiers may be disposed between the memory cell regions. A sense amplifier for a bit line may be disposed at a side of the memory cell region and a sense amplifier for a bit line bar may be disposed at the other side of the memory cell region. Each of the bit line sense amplifiers senses and amplifies data on a bit line and a bit line bar, each of which is coupled to different memory cell regions. According to the open bit line structure, which is different from a folded bit line structure where a bit line and a bit line bar are coupled to the same memory cell region, the first and second dummy memory cell regions DM09 and DM09' should be disposed on both sides.

Referring back to FIG. 7, the first circuit region 230 may include first to tenth upper memory cell region selection units UBS00 to UBS09, a first upper memory cell region control unit UFS00 to USF09 and URED0, a first to eleventh lower memory cell region selection units DBS00 to DBS09 and DBS09', and a first lower memory cell region control unit DFS00 to DFS09 and DRED0.

The first to tenth upper memory cell region selection units UBS00 to UBS09 may correspond to the first to tenth upper normal memory cell regions UM00 to UM09 of the first upper memory cell region group UMG0, respectively. The first upper memory cell region control unit UFS00 to USF09 and URED0 may control the first to tenth upper memory cell region selection units UBS00 to UBS09 in response to a first row address BXAR0. The first to eleventh lower memory cell region selection units DBS00 to DBS09 and DBS09' may correspond to the first to tenth lower normal memory cell regions DM00 to DM09 and DM09' of the first lower memory cell region group DMG0, respectively. The first lower memory cell region control unit DFS00 to DFS09 and DRED0 may control the first to eleventh lower memory cell region selection units DBS00 to DBS09 and DBS09' in response to the first row address BXAR0.

The first to tenth upper memory cell region selection units UBS00 to UBS09 may be disposed in the same sequence as the first to tenth upper normal memory cell regions UM00 to UM09. The first to eleventh lower memory cell region selection units DBS00 to DBS09 and DBS09' may be disposed in the same sequence as the first to ninth lower normal memory cell regions DM00 to DM08 and the first and second dummy memory cell region DM09 and DM09', or the first to tenth lower normal memory cell regions DM00 to DM09 and DM09'.

The first upper memory cell region control unit UFS00 to USF09 and URED0 may include first to tenth upper comparison units UFS00 to UFS09 and a first upper repair unit URED0.

The first to tenth upper comparison units UFS00 to UFS09 may correspond to the first to tenth upper memory cell region selection units UBS00 to UBS09, respectively. The first to tenth upper comparison units UFS00 to UFS09 may compare the first row address BXAR0 to pre-stored comparison addresses (not shown) and may generate first to tenth upper redundancy pre-signals UXHITB00 to UXHITB09. The first upper repair unit URED0 may generate an upper redundancy operation signal UNXEB0 in response to the first to tenth upper redundancy pre-signals UXHITB00 to UXHITB09.

For example, if the first row address BXAR0 and one of pre-stored comparison addresses are identical, then the first to tenth upper comparison units UFS00 to UFS09 may enable corresponding first to tenth upper redundancy pre-signals UXHITB00 to UXHITB09. The first upper repair unit URED0 may disable the first to tenth upper memory cell region selection units UBS00 to UBS09 by enabling the upper redundancy operation signal UNXEB0 if one or more of the first to tenth upper redundancy pre-signals UXHITB00 to UXHITB09 are enabled. The disabled first to tenth upper memory cell region selection units UBS00 to UBS09 may not select the first to tenth upper normal memory cell regions UM00 to UM09 of the first upper memory cell region group UMG0, regardless of any signal (not shown) for selecting the first to tenth upper normal memory cell regions UM00 to UM09 of the first upper memory cell region group UMG0.

The first to tenth upper comparison units UFS00 to UFS09 may be disposed in the same sequence as the first to tenth upper memory cell region selection units UBS00 to UBS09. The first upper repair unit URED0 may be disposed in a position corresponding to the middle of the first to tenth upper comparison units UFS00 to UFS09, or the fifth upper comparison unit UFS04.

The first lower memory cell region control unit DFS00 to DFS09 and DRED0 may include first to tenth lower comparison units DFS00 to DFS09 and a first lower repair unit DRED0.

The first to tenth lower comparison units DFS00 to DFS09 may correspond to the first to tenth lower memory cell region selection units DBS00 to DBS09, respectively. The first to tenth lower comparison units DFS00 to DFS09 may compare the first row address BXAR0 to each of pre-stored comparison addresses (not shown), and may generate first to tenth lower redundancy pre-signals DXHITB00 to DXHITB09. The first lower repair unit DRED0 may generate a lower redundancy operation signal DNXEB0 in response to the first to tenth lower redundancy pre-signals DXHITB00 to DXHITB09.

For example, if the first row address BXAR0 and one of pre-stored comparison addresses are identical, then the first to tenth lower comparison units DFS00 to DFS09 may enable corresponding first to tenth lower redundancy pre-signals DXHITB00 to DXHITB09. The first lower repair unit DRED0 may disable the first to eleventh lower memory cell region selection units DBS00 to DBS09 and DBS09' by enabling the lower redundancy operation signal DNXEB0 if one or more of the first to tenth lower redundancy pre-signals DXHITB00 to DXHITB09 are enabled. The disabled first to eleventh lower memory cell region selection units DBS00 to DBS09 and DBS09' may not select the first to tenth lower normal memory cell regions DM00 to DM09 and DM09' of the first lower memory cell region group DMG0, regardless of any signal (not shown) for selecting the first to tenth lower normal memory cell regions DM00 to DM09 and DM09' of the first lower memory cell region group DMG0.

The first to tenth lower comparison units DFS00 to DFS09 may be disposed in the same sequence as the first to tenth lower memory cell region selection units DBS00 to DBS09. The first lower repair unit DRED0 may be disposed in the middle of the first to tenth lower comparison units DFS00 to DFS09, or the fifth lower comparison unit DFS04.

Referring to FIG. 8, the second memory region 240 may include a plurality of normal memory cell regions UM10 to UM19 and DM10 to DM18 and first and second dummy memory cell regions DM19 and DM19' according to the open bit line structure.

The first dummy memory cell region DM19, the ninth to first lower normal memory cell regions DM18 to DM10, the tenth to first upper normal memory cell regions UM19 to UM10, and the second dummy memory cell region DM09' may be sequentially disposed about the peripheral region 210. That is, in the column direction, the ninth to first lower normal memory cell regions DM18 to DM10 and the tenth to first upper normal memory cell regions UM19 to UM10 may be serially disposed, the first dummy memory cell region DM19 may be disposed over the ninth lower normal memory cell region DM18, and the second dummy memory cell region DM19' may be disposed under the first upper normal memory cell region UM10.

The first and second dummy memory cell regions DM19 and DM19' may serve as a normal memory cell region or a tenth lower normal memory cell region according to control of the peripheral region 210. That is, the first dummy memory cell region DM19 may serve as half of the tenth lower normal memory cell region and the second dummy memory cell region DM19' may serve as the other half of the tenth lower normal memory cell region. Consequently, the second memory region 240 may include the first to tenth normal memory cell regions UM10 to UM19 and the first to tenth lower normal memory cell regions DM10 to DM19 and DM19'.

Hereinafter, the group of the first to tenth upper normal memory cell regions UM10 to UM19 may also be referred to as a second upper memory cell region group UMG1, and the group of the first to tenth lower normal memory cell regions DM10 to DM19 and DM19' may be referred to as a second lower memory cell region group DMG1. The term of the first to tenth upper normal memory cell regions UM10 to UM19 or the second upper memory cell region group UMG1 will be selectively used when necessary. Also, the term of the first to tenth lower normal memory cell regions DM10 to DM19 and DM19' or the second lower memory cell region group DMG1 will be selectively used when necessary.

The second circuit region 250 may include first to tenth upper memory cell region selection units UBS10 to UBS19, a second upper memory cell region control unit UFS10 to USF 19 and URED1, a first to eleventh lower memory cell region selection units DBS10 to DBS19 and DBS19' and a second lower memory cell region control unit DFS10 to DFS19 and DRED1.

The first to tenth upper memory cell region selection units UBS10 to UBS19 may correspond to the first to tenth upper normal memory cell regions UM10 to UM19 of the second upper memory cell region group UMG1, respectively. The second upper memory cell region control unit UFS10 to USF19 and URED1 may control the first to tenth upper memory cell region selection units UBS10 to UBS19 in response to a second row address BXAR1. The first to eleventh lower memory cell region selection units DBS10 to DBS19 and DBS19' may correspond to the first to tenth lower normal memory cell regions DM10 to DM19 and DM19' of the second lower memory cell region group DMG1, respectively. The second lower memory cell region control unit DFS10 to DFS19 and DRED1 may control the first to eleventh lower memory cell region selection units DBS10 to DBS19 and DBS19' in response to the second row address BXAR1.

The first to tenth upper memory cell region selection units UBS10 to UBS19 may be disposed in the same sequence as the first to tenth upper normal memory cell regions UM10 to UM19. The first to eleventh lower memory cell region selection units DBS10 to DBS19 and DBS19' may be disposed in the same sequence as the first to ninth lower normal memory cell regions DM10 to DM18 and the first and second dummy memory cell region DM19 and DM19', or the first to tenth lower normal memory cell regions DM10 to DM19 and DM19'.

The second upper memory cell region control unit UFS10 to USF19 and URED1 may include first to tenth upper comparison units UFS10 to UFS19 and a second upper repair unit URED1.

The first to tenth upper comparison units UFS10 to UFS19 may correspond to the first to tenth upper memory cell region selection units UBS10 to UBS19, respectively. The first to tenth upper comparison units UFS10 to UFS19 may compare the second row address BXAR1 to pre-stored comparison addresses (not shown) and may generate first to tenth upper redundancy pre-signals UXHITB10 to UXHITB19. The second upper repair unit URED1 may generate an upper redundancy operation signal UNXEB1 in response to the first to tenth upper redundancy pre-signals UXHITB10 to UXHITB19.

For example, if the second row address BXAR1 and one of pre-stored comparison addresses are identical, then the first to tenth upper comparison units UFS10 to UFS19 may enable corresponding first to tenth upper redundancy pre-signals UXHITB10 to UXHITB19. The second upper repair unit URED1 may disable the first to tenth upper memory cell region selection units UBS10 to UBS19 by enabling the upper redundancy operation signal UNXEB1, if one or more of the first to tenth upper redundancy pre-signals UXHITB10 to UXHITB19 are enabled. The disabled first to tenth upper memory cell region selection units UBS10 to UBS19 may not select the first to tenth upper normal memory cell regions UM10 to UM19 of the second upper memory cell region group UMG1, regardless of any signal (not shown) for selecting the first to tenth upper normal memory cell regions UM10 to UM19 of the second upper memory cell region group UMG1.

The first to tenth upper comparison units UFS10 to UFS19 may be disposed in the same sequence as the first to tenth upper memory cell region selection units UBS10 to UBS19. The second upper repair unit URED1 may be disposed in a position corresponding to the middle of the first to tenth upper comparison units UFS10 to UFS19, or the fifth upper comparison unit UFS14.

The second lower memory cell region control unit DFS10 to DFS19 and DRED1 may include first to tenth lower comparison units DFS10 to DFS19 and a second lower repair unit DRED1.

The first to tenth lower comparison units DFS10 to DFS19 may correspond to the first to tenth lower memory cell region selection units DBS10 to DBS19, respectively. The first to tenth lower comparison units DFS10 to DFS19 may compare the second row address BXAR1 to pre-stored comparison addresses (not shown) and may generate first to tenth lower redundancy pre-signals DXHITB10 to DXHITB19. The second lower repair unit DRED1 may generate a lower redundancy operation signal DNXEB1 in response to the first to tenth lower redundancy pre-signals DXHITB10 to DXHITB19.

For example, if the second row address BXAR1 and one of pre-stored comparison addresses are identical, then the first to tenth lower comparison units DFS10 to DFS19 may enable corresponding first to tenth lower redundancy pre-signals DXHITB10 to DXHITB19. The second lower repair unit DRED1 may disable the first to eleventh lower memory cell region selection units DBS10 to DBS19 and DBS19' by enabling the lower redundancy operation signal DNXEB1, if one or more of the first to tenth lower redundancy pre-signals DXHITB10 to DXHITB19 are enabled. The disabled first to eleventh lower memory cell region selection units DBS10 to DBS19 and DBS19' may not select the first to tenth lower normal memory cell regions DM10 to DM19 and DM19' of the second lower memory cell region group DMG1, regardless of any signal (not shown) for selecting the first to tenth lower normal memory cell regions DM10 to DM19 and DM19' of the second lower memory cell region group DMG1.

The first to tenth lower comparison units DFS10 to DFS19 may be disposed in the same sequence as the first to tenth lower memory cell region selection units DBS10 to DBS19. The second lower repair unit DRED1 may be disposed in the middle of the first to tenth lower comparison units DFS10 to DFS19, or the fifth lower comparison unit DFS14.

An operation of the semiconductor device 200, in accordance with an exemplary embodiment of the present invention will now be described.

Operation of the first circuit region 230 is as follows.

If the first row address BXAR0 is input with a write command or a read command, then the first upper memory cell region control unit UFS00 to USF09 and URED0 and the first lower memory cell region control unit DFS00 to DSF09 and DRED0 may determine whether or not to enable the upper redundancy operation signal UNXEB0 based on whether or not the first row address BXAR0 corresponds to a failed memory cell.

For example, the first to tenth upper comparison units UFS00 to UFS09 may compare the first row address BXAR0 to the pre-stored comparison addresses and may generate the first to tenth upper redundancy pre-signals UXHITB00 to UXHITB09. The first upper repair unit URED0 may enable the upper redundancy operation signal UNXEB0 when one or more of the first to tenth upper redundancy pre-signals UXHITB00 to UXHITB09 are enabled. The first to tenth lower comparison units DFS00 to DFS09 may compare the first row address BXAR0 to the pre-stored comparison addresses and may generate the first to tenth lower redundancy pre-signals DXHITB00 to DXHITB09. The first lower repair unit DRED0 may enable the lower redundancy operation signal DNXEB0 if one or more of the first to tenth lower redundancy pre-signals DXHITB00 to DXHITB09 are enabled.

Enablement of the first to tenth upper memory cell region selection units UBS00 to UBS09 may depend on the upper redundancy operation signal UNXEB0.

For example, the first to tenth upper memory cell region selection units UBS00 to UBS09 may not select the first to tenth upper normal memory cell regions UM00 to UM09 of the first upper memory cell region group UMG0 regardless of any signal for selecting the first to tenth upper normal memory cell regions UM00 to UM09 of the first upper memory cell region group UMG0, if the upper redundancy operation signal UNXEB0 is enabled. Therefore, selection of a failed memory cell included in the first upper memory cell region group UMG0 may be prevented. On the other hand, the first to tenth upper memory cell region selection units UBS00 to UBS09 may select one or more of the first to tenth upper normal memory cell regions UM00 to UM09 of the first upper memory cell region group UMG0, according to a signal (not shown) for selecting the first to tenth upper normal memory cell regions UM00 to UM09 of the first upper memory cell region group UMG0, if the upper redundancy operation signal UNXEB0 is disabled.

Enablement of the first to eleventh lower memory cell region selection units DBS00 to DBS09 and DBS09' depends on the lower redundancy operation signal DNXEB0. For example, the first to eleventh lower memory cell region selection units DBS00 to DBS09 and DBS09' may not select the first to tenth lower normal memory cell regions DM00 to DM09 and DM09' of the first lower memory cell region group DMG0, regardless of any signal for selecting the first to tenth lower normal memory cell regions DM00 to DM09 and DM09' of the first lower memory cell region group DMG0, if the lower redundancy operation signal DNXEB0 is enabled. Therefore, selection of a failed memory cell included in the first lower memory cell region group DMG0 may be prevented. On the other hand, the first to eleventh lower memory cell region selection units DBS00 to DBS09 and DBS09' may select one or more of the first to tenth lower normal memory cell regions DM00 to DM09 and DM09' of the first lower memory cell region group DMG0, according to a signal for selecting the first to tenth lower normal memory cell regions DM00 to DM09 and DM09' of the first lower memory cell region group DMG0, if the lower redundancy operation signal DNXEB0 is disabled.

The longest path in the first circuit region 230 from the start of transmission of the first row address BXAR0 to completion of transmission of the lower redundancy operation signal DNXEB0 is as follows.

Figure 9:
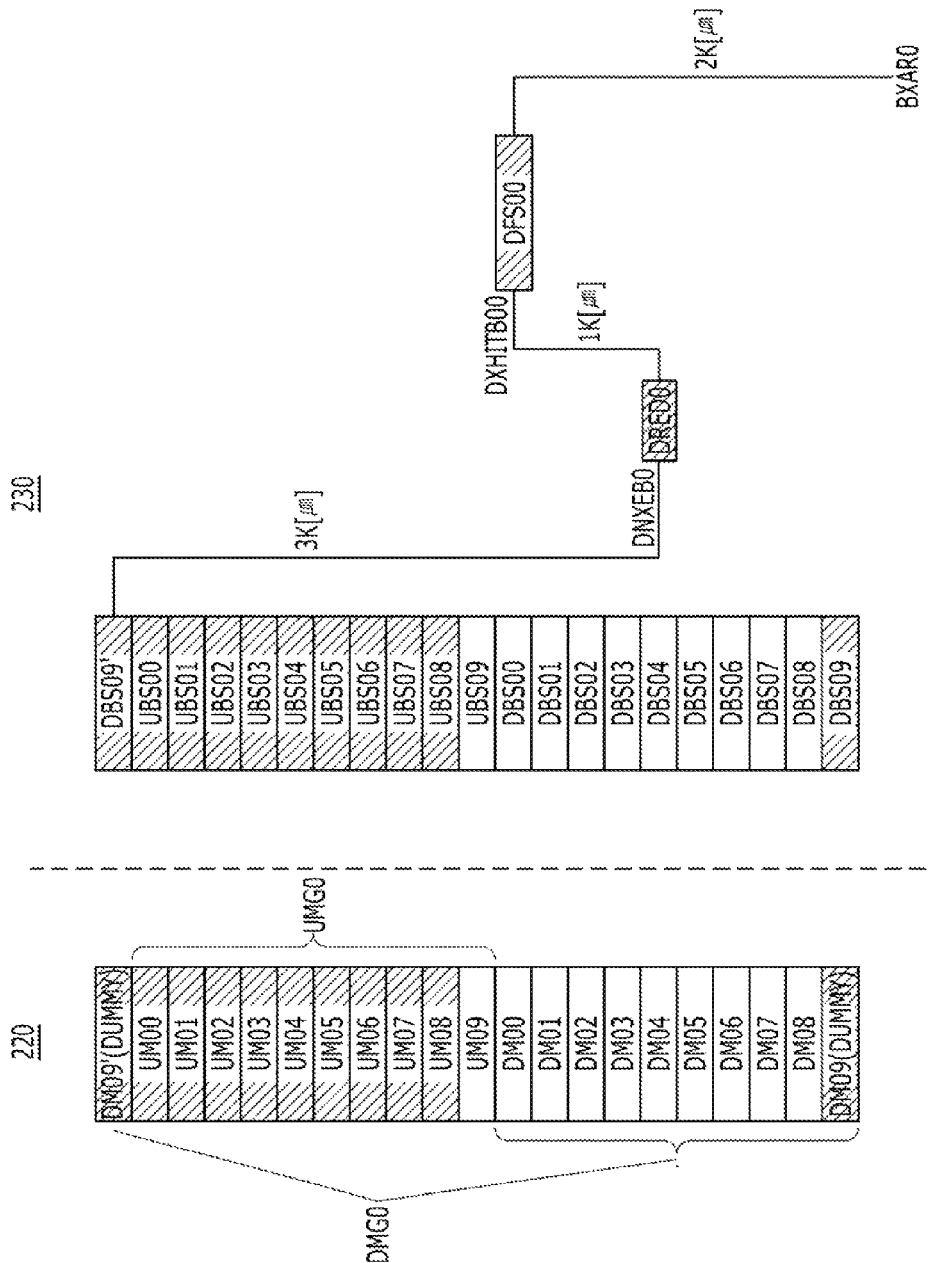
FIG. 9 is a block diagram illustrating the longest path in the first circuit region shown in FIG. 7.

FIG. 9 is a block diagram illustrating the longest path in the first circuit region 230 shown in FIG. 7.

Referring to FIG. 9, the longest path in the first circuit region 230 corresponds to a case where the first row address BXAR0 is identical to the pre-stored comparison address stored in the first lower comparison unit DFS00 and the eleventh lower memory cell region selection unit DBS09' is disabled according to the lower redundancy operation signal DNXEB0. In such case, the longest path in the first circuit region 230 may be a sum of paths for transmission of the first row address BXAR0 (2K[μm]), the first lower redundancy free signal DXHITB00 (1K[μm]) and the lower redundancy operation signal DNXEB0 (3K[μm]), which corresponds to 6K[μm].

Operation of the second circuit region 250 is as follows.

If the second row address BXAR1 is input with a write command or a read command, then the second upper memory cell region control unit UFS10 to USF19 and URED1 and the second lower memory cell region control unit DFS10 to DSF19 and DRED1 may determine whether or not to enable the upper redundancy operation signal UNXEB1 based on whether the second row address BXAR1 corresponds to a failed memory cell. For example, the first to tenth upper comparison units UFS10 to UFS19 may compare the second row address BXAR1 and the pre-stored comparison addresses and may generate the first to tenth upper redundancy pre-signals UXHITB10 to UXHITB19. The second upper repair unit URED1 may enable the upper redundancy operation signal UNXEB1 if one or more of the first to tenth upper redundancy pre-signals UXHITB00 to UXHITB09 are enabled. The first to tenth lower comparison units DFS10 to DFS19 may compare the second row address BXAR1 to the pre-stored comparison addresses and may generate the first to tenth lower redundancy pre-signals DXHITB10 to DXHITB19. The second lower repair unit DRED1 enables the lower redundancy operation signal DNXEB1 if one or more of the first to tenth lower redundancy pre-signals DXHITB10 to DXHITB19 are enabled.

Enablement of the first to tenth upper memory cell region selection units UBS10 to UBS19 may depend on the upper redundancy operation signal UNXEB1. For example, the first to tenth upper memory cell region selection units UBS10 to UBS19 may not select the first to tenth upper normal memory cell regions UM10 to UM19 of the second upper memory cell region group UMG1, regardless of any signal for selecting the first to tenth upper normal memory cell regions UM10 to UM19 of the second upper memory cell region group UMG1, if the upper redundancy operation signal UNXEB1 is enabled. Therefore, selection of a failed memory cell included in the second upper memory cell region group UMG1 may be prevented. On the other hand, the first to tenth upper memory cell region selection units UBS10 to UBS19 may select one or more of the first to tenth upper normal memory cell regions UM10 to UM19, of the second upper memory cell region group UMG1, according to a signal for selecting the first to tenth upper normal memory cell regions UM10 to UM19 of the second upper memory cell region group UMG1 if the upper redundancy operation signal UNXEB1 is disabled.

Enablement of the first to eleventh lower memory cell region selection units DBS10 to DBS19 and DBS19' may depend on the lower redundancy operation signal DNXEB1. For example, the first to eleventh lower memory cell region selection units DBS10 to DBS19 and DBS19' may not select the first to tenth lower normal memory cell regions DM10 to DM19 and DM19' of the second lower memory cell region group DMG1, regardless of any signal for selecting the first to tenth lower normal memory cell regions DM10 to DM19 and DM19' of the second lower memory cell region group DMG1, if the lower redundancy operation signal DNXEB1 is enabled. Therefore, selection of a failed memory cell included in the second lower memory cell region group DMG1 may be prevented. On the other hand, the first to eleventh lower memory cell region selection units DBS10 to DBS19 and DBS19' may select one or more of the first to tenth lower normal memory cell regions DM10 to DM19 and DM19' of the second lower memory cell region group DMG1, according to a signal for selecting the first to tenth lower normal memory cell regions DM10 to DM19 and DM19' of the second lower memory cell region group DMG1, if the lower redundancy operation signal DNXEB1 is disabled.

The longest path in the second circuit region 250 from the start of transmission of the second row address BXAR1 to completion of transmission of the lower redundancy operation signal DNXEB1 is as follows.

Figure 10:
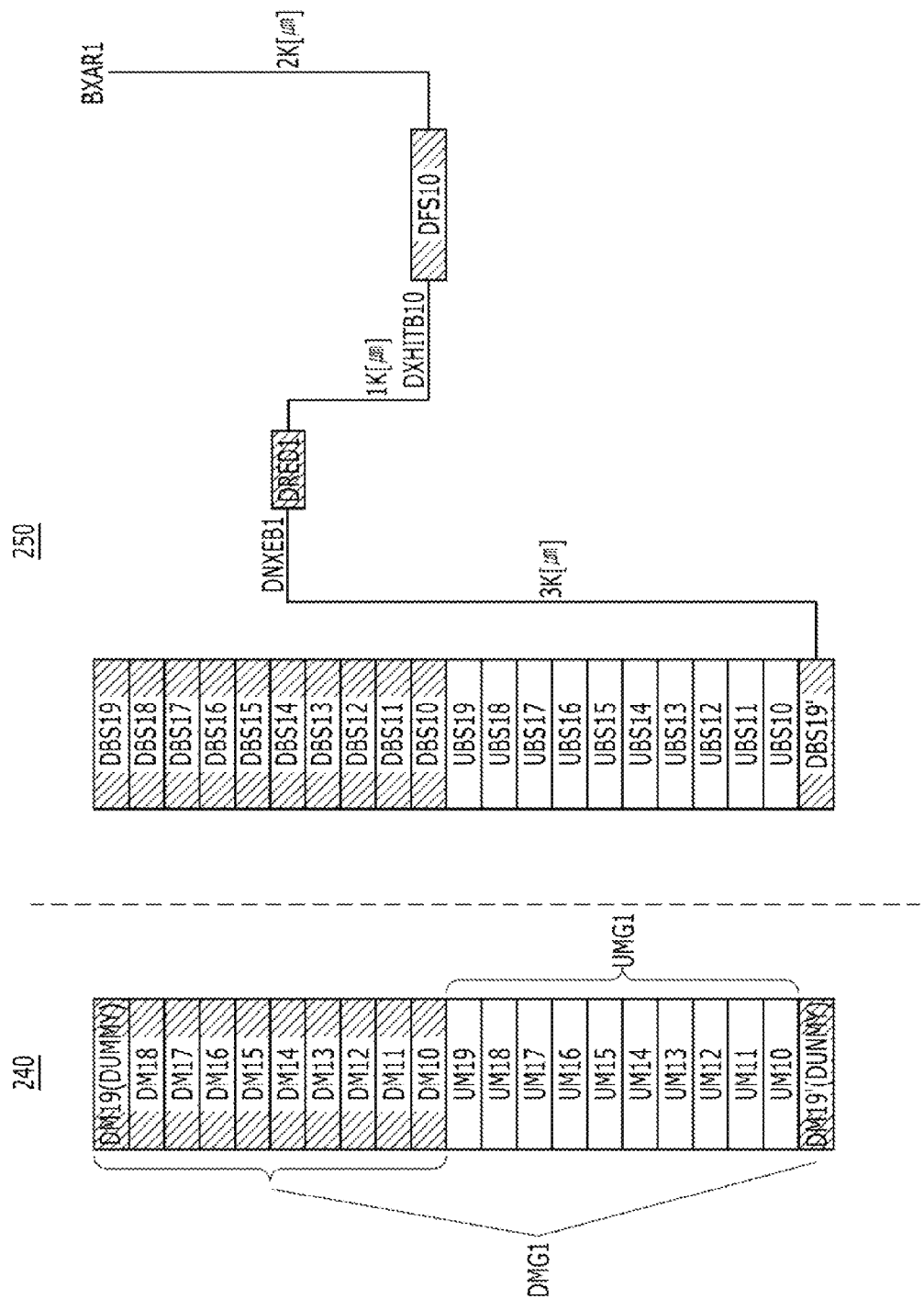
FIG. 10 is a block diagram illustrating the longest path in the second circuit region shown in FIG. 8.

FIG. 10 is a block diagram illustrating the longest path in the second circuit region 250 shown in FIG. 8.

Referring to FIG. 10, the longest path in the second circuit region 250 may correspond to where the second row address BXAR1 is identical to the pre-stored comparison address stored in the first lower comparison unit DFS10 and the eleventh lower memory cell region selection unit DBS19' is disabled according to the lower redundancy operation signal DNXEB1. In such a case, the longest path in the second circuit region 250 may be sum of paths for transmission of the second row address BXAR1 (2K[μm]), the first lower redundancy free signal DXHITB10 (1K[μm]) and the lower redundancy operation signal DNXEB1 (3K[μm]), which corresponds to 6K[μm].

In accordance with an exemplary embodiment of the present invention, elements included in the first and second circuit regions 230 and 250 may be disposed symmetrically about the peripheral region 210 and therefore the semiconductor device may have the same longest path between the first and second circuit regions 230 and 250.

Figure 11:
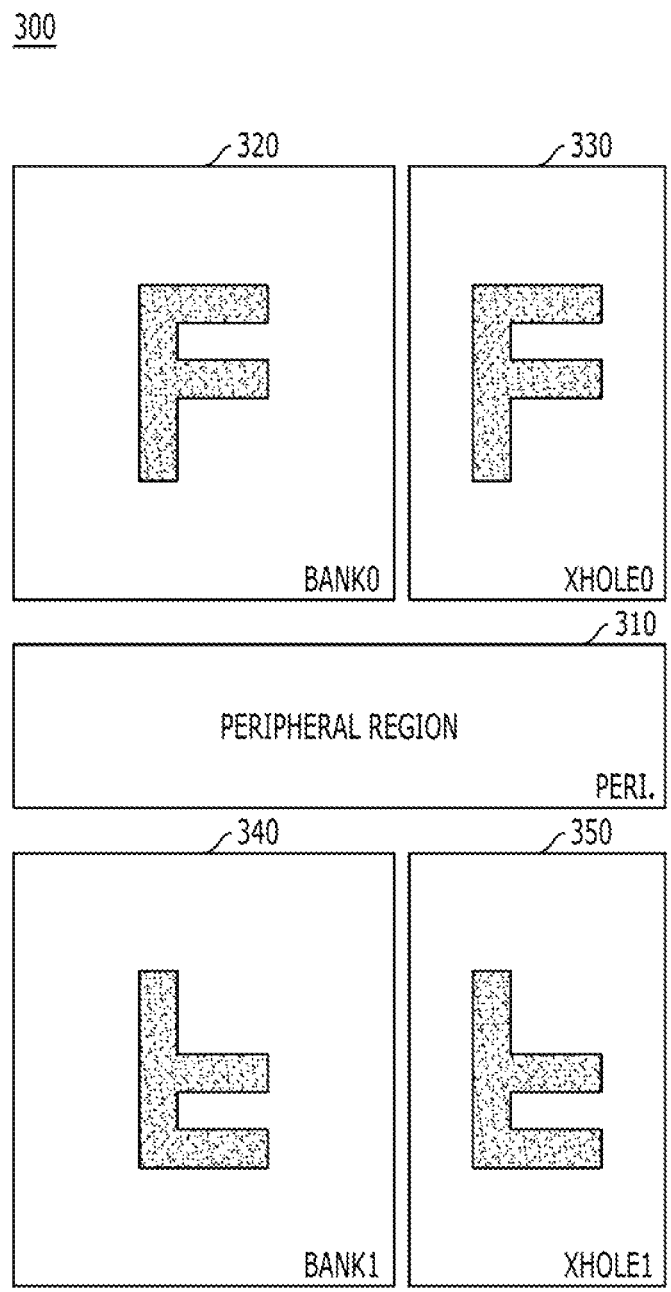
FIG. 11 is a block diagram illustrating a semiconductor device in accordance with an exemplary embodiment of the present invention.

FIG. 11 is a block diagram illustrating a semiconductor device in accordance with an exemplary embodiment of the present invention.

Referring to FIG. 11, the semiconductor device 300 may comprise a peripheral region 310, a first memory region 320, a first circuit region 330, a second memory region 340, and a second circuit region 350. The peripheral region 310 may be coupled to an external device (not shown). The first memory region 320 may be disposed at a side of the peripheral region 310. The first circuit region 330 may be disposed at a side of the peripheral region 310 and configured to control the first memory region 320. The second memory region 340 may be disposed at the other side of the peripheral region 310. The second circuit region 350 may be disposed at the other side of the peripheral region 310 and configured to control the second memory region 340. The first and second memory regions 320 and 340 may be symmetrically disposed about the peripheral region 310 and the first and second circuit regions 330 and 350 may be symmetrically disposed about the peripheral region 310.

It is noted that in this exemplary embodiment of the present invention, "symmetrical disposition/structure" may refer to physical input and output path of the elements.

The peripheral region 310 may serve as a medium between internal circuits of the first and second memory regions 320 and 340, first and second circuit regions 330 and 350, and the external device. For example, the peripheral region 310 may interface the internal circuits of the first and second memory regions 320 and 340, first and second circuit regions 330 and 350, and the external device for communication of data, an address and a command.

Figure 12:
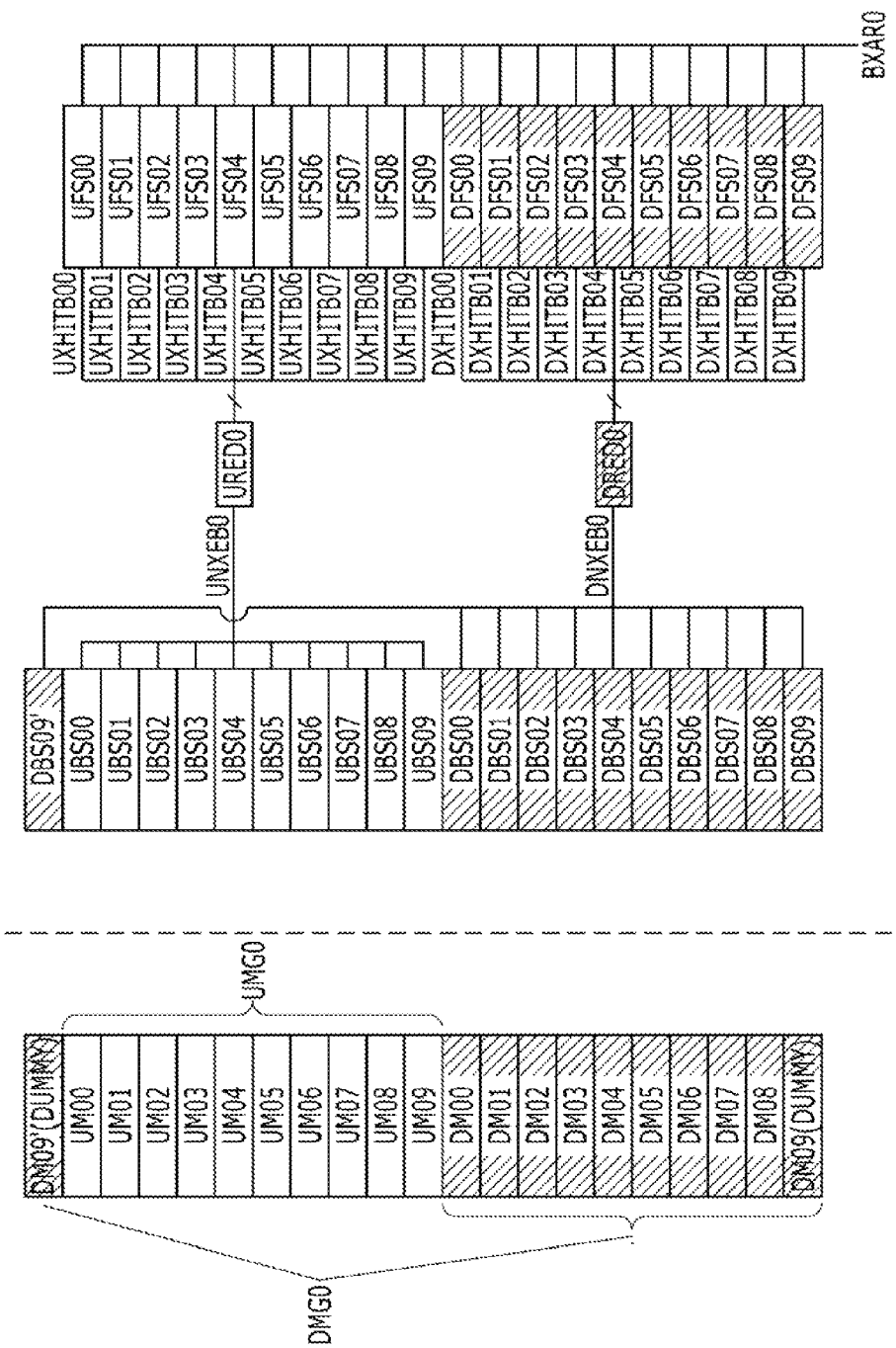
FIG. 12 is a block diagram illustrating a first memory region and a first circuit region of the exemplary semiconductor device shown in FIG. 11.
Figure 13:
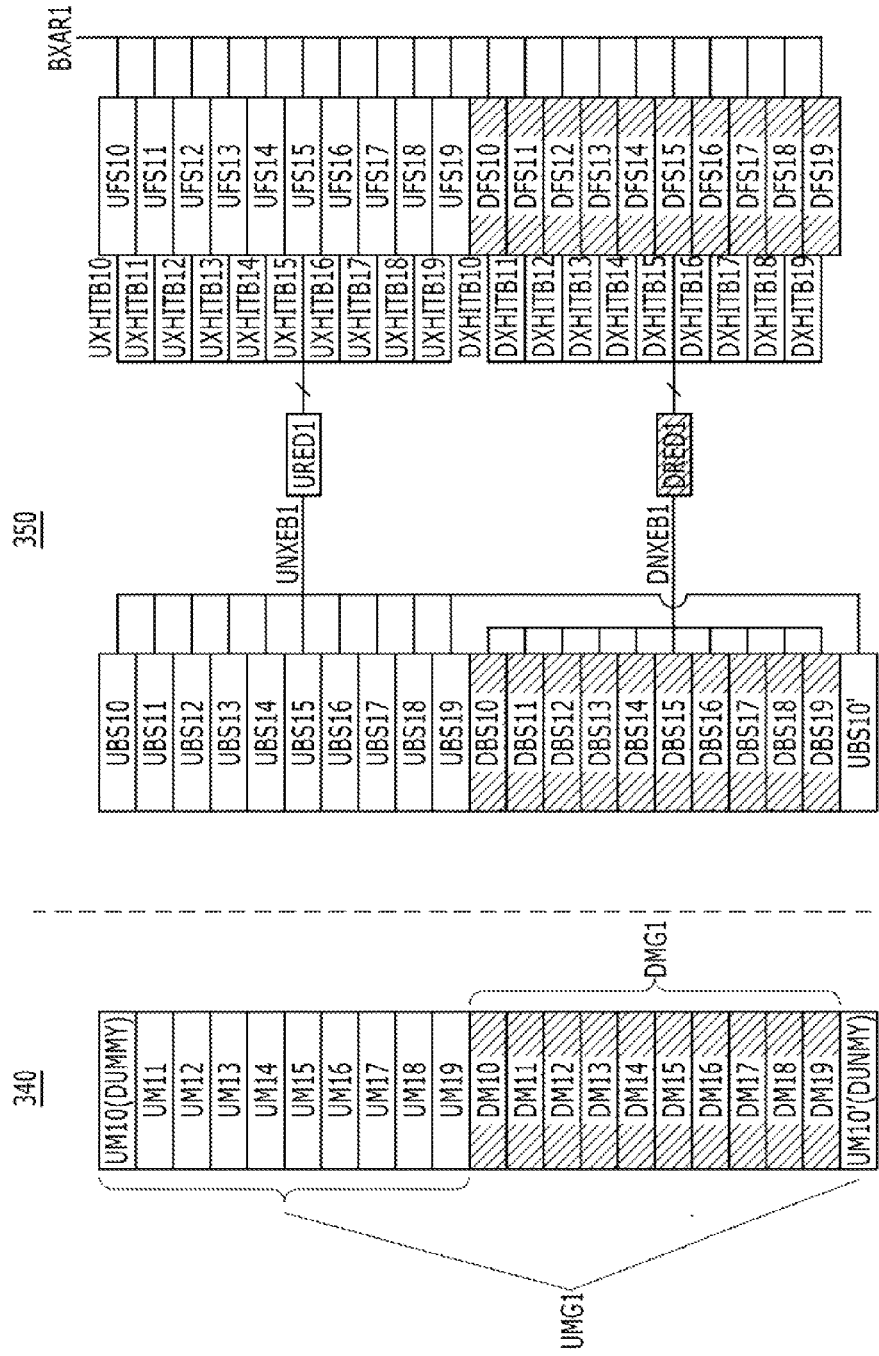
FIG. 13 is a block diagram illustrating a second memory region and a second circuit region of a exemplary semiconductor device shown in FIG. 11.

FIG. 12 is a block diagram illustrating the first memory region 320 and the first circuit region 330 shown in FIG. 11. FIG. 13 is a block diagram illustrating the second memory region 340 and the second circuit region 350 shown in FIG. 11.

It is noted that the first circuit region 330 of FIG. 12 shows an arrangement for blocking the path for selection of the first memory region 320, and the second circuit region 350 of FIG. 13 shows an arrangement for blocking the path for selection of the second memory region 340.

The first memory region 320 and the first circuit region 330, shown in FIG. 12, may be the same as the first memory region 220 and the first circuit region 230 as described above with reference to FIG. 7.

Referring to FIG. 13, the second memory region 340 may include a plurality of normal memory cell regions UM11 to UM19 and DM10 to DM19 and first and second dummy memory cell regions UM10 and UM10', according to the open bit line structure.

The first dummy memory cell region UM10, the second to tenth normal memory cell regions UM11 to UM19, the first to tenth lower normal memory cell regions DM10 to DM19, and the second dummy memory cell region UM10' may be sequentially disposed about the peripheral region 310. That is, in the column direction, the second to tenth upper normal memory cell regions UM11 to UM19 and the first to tenth lower normal memory cell regions DM10 to DM19 may be serially disposed, the first dummy memory cell region UM10 may be disposed over the second upper normal memory cell region UM11 and the second dummy memory cell region UM10' may be disposed under the tenth lower normal memory cell region DM19.

The first and second dummy memory cell regions UM10 and UM10' may serve as a normal memory cell region or a first upper normal memory cell region according to control of the peripheral region 310. That is, the first dummy memory cell region UM10 may serve as half of the first upper normal memory cell region and the second dummy memory cell region UM10' may serve as the other half of the first upper normal memory cell region. Consequently, the second memory region 340 may include the first to tenth normal memory cell regions UM10 to UM19 and UM10' and the first to tenth lower normal memory cell regions DM10 to DM19.

The group of the first to tenth upper normal memory cell regions UM10 to UM19 and UM10' may also be referred to as a second upper memory cell region group UMG1, and the group of the first to tenth lower normal memory cell regions DM10 to DM19 may be referred to as a second lower memory cell region group DMG1. The term of the first to tenth upper normal memory cell regions UM10 to UM19 and UM10' or the second upper memory cell region group UMG1 will be selectively used when necessary. Also, the term of the first to tenth lower normal memory cell regions DM10 to DM19 or the second lower memory cell region group DMG1 will be selectively used when necessary.

As shown in FIGS. 12 and 13, the second memory region 340 with such structure may have the same memory cell region arrangement as the first memory region 320, but may logically have an arrangement with one memory cell region-shifted in comparison with the first memory region 320.

Referring back to FIG. 13, the second circuit region 350 may include first to eleventh upper memory cell region selection units UBS10 to UBS19 and UBS10', a second upper memory cell region control unit UFS10 to USF 19 and URED1, a first to tenth lower memory cell region selection units DBS10 to DBS19 and a second lower memory cell region control unit DFS10 to DFS19 and DRED1.

The first to eleventh upper memory cell region selection units UBS10 to UBS19 and UBS10' may correspond to the first to tenth upper normal memory cell regions UM10 to UM19 and UM10' of the second upper memory cell region group UMG1, respectively. The second upper memory cell region control unit UFS10 to USF19 and URED1 may control the first to eleventh upper memory cell region selection units UBS10 to UBS19 and UBS10' in response to a second row address BXAR1. The first to tenth lower memory cell region selection units DBS10 to DBS19 may correspond to the first to tenth lower normal memory cell regions DM10 to DM19 of the second lower memory cell region group DMG1, respectively. The second lower memory cell region control unit DFS10 to DFS19 and DRED1 may control the first to tenth lower memory cell region selection units DBS10 to DBS19 in response to the second row address BXAR1.

The first to eleventh upper memory cell region selection units UBS10 to UBS19 and UBS10' may be disposed with the same sequence as the second to tenth upper normal memory cell regions UM11 to UM19 and the first and second dummy memory cell regions UM10 and UM10' or the first to tenth upper normal memory cell regions UM10 to UM19 and UM10'. The first to tenth lower memory cell region selection units DBS10 to DBS19 may be disposed with the same sequence as the first to tenth lower normal memory cell regions DM10 to DM19.

Accordingly, the output paths of the second upper memory cell region control unit UFS10 to USF19 and URED1 and the first lower memory cell region control unit DFS00 to DFS09 and DRED0 included in the first circuit region 330 may be disposed symmetrically about the peripheral region 310. Also, the output paths of the second lower memory cell region control unit DFS10 to DSF19 and DRED1 and the first upper memory cell region control unit UFS00 to UFS09 and URED0, included in the first circuit region 330, may be disposed symmetrically about the peripheral region 310.

The second upper memory cell region control unit UFS10 to USF19 and URED1 may include first to tenth upper comparison units UFS10 to UFS19 and a second upper repair unit URED1.

The first to tenth upper comparison units UFS10 to UFS19 may correspond to the first to tenth upper memory cell region selection units UBS10 to UBS19, respectively. The first to tenth upper comparison units UFS10 to UFS19 may compare the second row address BXAR1 to pre-stored comparison addresses (not shown) and may generate first to tenth upper redundancy pre-signals UXHITB10 to UXHITB19. The second upper repair unit URED1 may generate an upper redundancy operation signal UNXEB1 in response to the first to tenth upper redundancy pre-signals UXHITB10 to UXHITB19.

For example, if the second row address BXAR1 and one of pre-stored comparison addresses are identical, then the first to tenth upper comparison units UFS10 to UFS19 may enable corresponding first to tenth upper redundancy pre-signals UXHITB10 to UXHITB19. The second upper repair unit URED1 may disable the first to eleventh upper memory cell region selection units UBS10 to UBS19 and UBS10' by enabling the upper redundancy operation signal UNXEB1 if one or more of the first to tenth upper redundancy pre-signals UXHITB10 to UXHITB19 are enabled. The disabled first to eleventh upper memory cell region selection units UBS10 to UBS19 and UBS10' may not select the first to tenth upper normal memory cell regions UM10 to UM19 and UM10' of the second upper memory cell region group UMG1, regardless of any signal (not shown) for selecting the first to tenth upper normal memory cell regions UM10 to UM19 and UM10' of the second upper memory cell region group UMG1.

The first to tenth upper comparison units UFS10 to UFS19 may be disposed with the same sequence as the first to tenth upper memory cell region selection units UBS10 to UBS19. The second upper repair unit URED1 may be disposed in the middle of the first to tenth upper comparison units UFS10 to UFS19, or the sixth upper comparison unit UFS15.

The second lower memory cell region control unit DFS10 to DFS19 and DRED1 may include first to tenth lower comparison units DFS10 to DFS19 and a second lower repair unit DRED1.

The first to tenth lower comparison units DFS10 to DFS19 may correspond to the first to tenth lower memory cell region selection units DBS10 to DBS19, respectively. The first to tenth lower comparison units DFS10 to DFS19 may compare the second row address BXAR1 to pre-stored comparison addresses (not shown) and may generate first to tenth lower redundancy pre-signals DXHITB10 to DXHITB19. The second lower repair unit DRED1 may generate a lower redundancy operation signal DNXEB1 in response to the first to tenth lower redundancy pre-signals DXHITB10 to DXHITB19.

For example, if the second row address BXAR1 and one of pre-stored comparison addresses are identical, then the first to tenth lower comparison units DFS10 to DFS19 may enable corresponding first to tenth lower redundancy pre-signals DXHITB10 to DXHITB19. The second lower repair unit DRED1 may disable the first to tenth lower memory cell region selection units DBS10 to DBS19 by enabling the lower redundancy operation signal DNXEB1 if one or more of the first to tenth lower redundancy pre-signals DXHITB10 to DXHITB19 are enabled. The disabled first to tenth lower memory cell region selection units DBS10 to DBS19 may not select the first to tenth lower normal memory cell regions DM10 to DM19 of the second lower memory cell region group DMG1, regardless of any signal (not shown) for selecting the first to tenth lower normal memory cell regions DM10 to DM19 of the second lower memory cell region group DMG1.

The first to tenth lower comparison units DFS10 to DFS19 may be disposed in the same sequence as the first to tenth lower memory cell region selection units DBS10 to DBS19. The second lower repair unit DRED1 may be disposed in the middle of the first to tenth lower comparison units DFS10 to DFS19, or the sixth lower comparison unit DFS15.

Operation of the semiconductor device 300 in accordance with an embodiment of the present invention will be described next.

Operation of the first circuit region 330 is as follows.

Operation of the first circuit region 330 may be the same as the first circuit 230 described above with reference to FIGS. 7 and 9.

Figure 14:
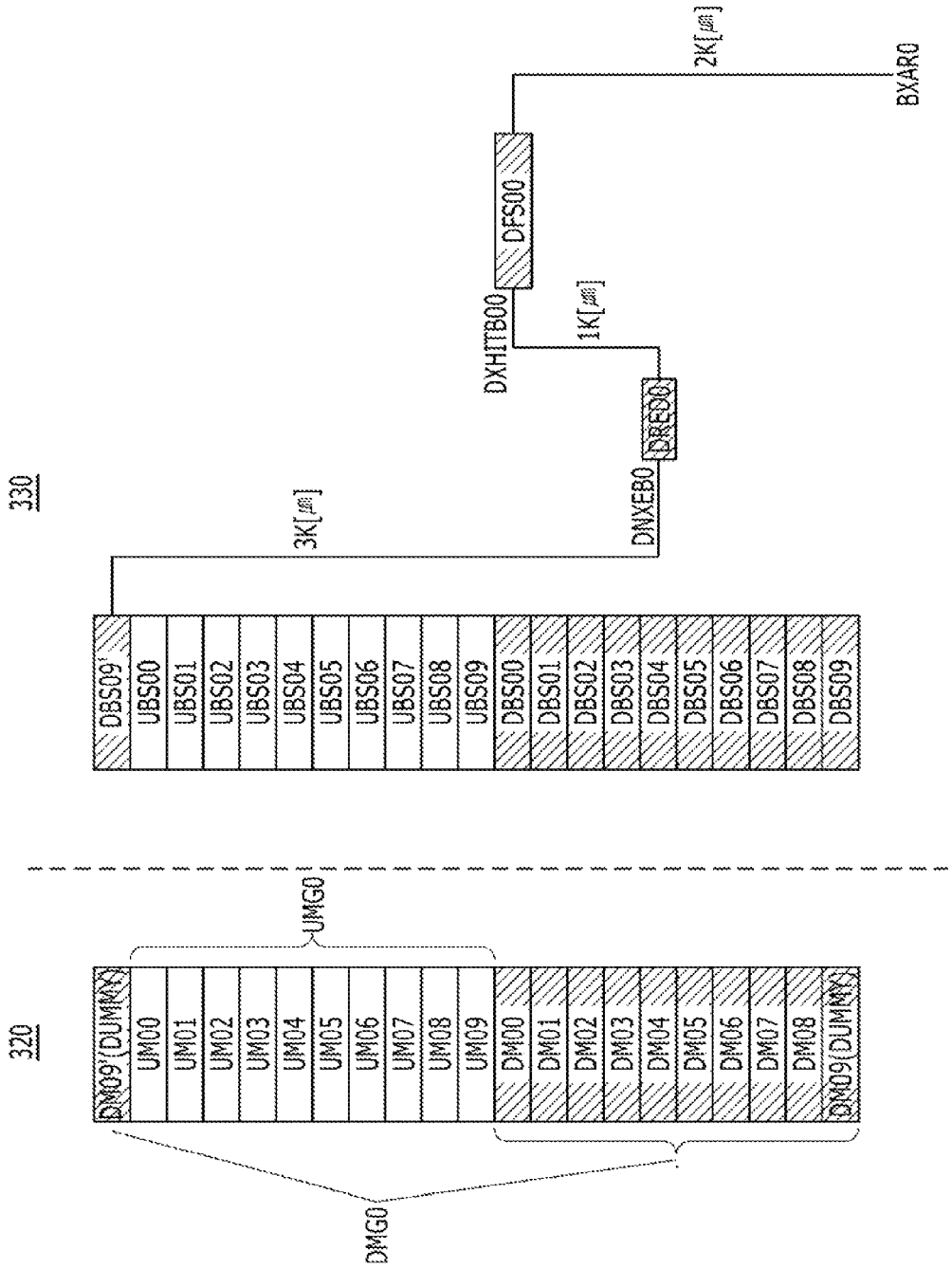
FIG. 14 is a block diagram illustrating the longest path in the first circuit region shown in FIG. 12.

FIG. 14 is a block diagram illustrating the longest path in the first circuit region 330 shown in FIG. 12.

Referring to FIG. 14, the longest path in the first circuit region 230 corresponds to a case where the first row address BXAR0 is identical to the pre-stored comparison address stored in the first lower comparison unit DFS00 and the eleventh lower memory cell region selection unit DBS09' is disabled according to the lower redundancy operation signal DNXEB0. In such case, the longest path in the first circuit region 230 may be sum of paths for transmission of the first row address BXAR0 (2K[μm]), the first lower redundancy free signal DXHITB00 (1K[μm]) and the lower redundancy operation signal DNXEB0 (3K[μm]), which corresponds to 6K[μm].

Operation of the second circuit region 350 is as follows.

If the second row address BXAR1 is input with a write command or a read command, then the second upper memory cell region control unit UFS10 to USF19 and URED1, and the second lower memory cell region control unit DFS10 to DSF19 and DRED1, may determine whether or not to enable the upper redundancy operation signal UNXEB1 based on whether the second row address BXAR1 corresponds to a failed memory cell.

For example, the first to tenth upper comparison units UFS10 to UFS19 may compare the second row address BXAR1 to the pre-stored comparison addresses and may generate the first to tenth upper redundancy pre-signals UXHITB10 to UXHITB19. The second upper repair unit URED1 may enable the upper redundancy operation signal UNXEB1 if one or more of the first to tenth upper redundancy pre-signals UXHITB00 to UXHITB09 are enabled. The first to tenth lower comparison units DFS10 to DFS19 may compare the second row address BXAR1 to the pre-stored comparison addresses and may generate the first to tenth lower redundancy pre-signals DXHITB10 to DXHITB19. The second lower repair unit DRED1 may enable the lower redundancy operation signal DNXEB1 if one or more of the first to tenth lower redundancy pre-signals DXHITB10 to DXHITB19 are enabled.

Enablement of the first to eleventh upper memory cell region selection units UBS10 to UBS19 and UBS10' may depend on the upper redundancy operation signal UNXEB1.

For example, the first to eleventh upper memory cell region selection units UBS10 to UBS19 and UBS10' may not select the first to tenth upper normal memory cell regions UM10 to UM19 and UM10' of the second upper memory cell region group UMG1, regardless of any signal for selecting the first to tenth upper normal memory cell regions UM10 to UM19 and UM10' of the second upper memory cell region group UMG1 if the upper redundancy operation signal UNXEB1 is enabled. Therefore, selection of a failed memory cell included in the second upper memory cell region group UMG1 may be prevented. On the other hand, the first to eleventh upper memory cell region selection units UBS10 to UBS19 and UBS10' may select one or more of the first to tenth upper normal memory cell regions UM10 to UM19 and UM10' of the second upper memory cell region group UMG1, according to a signal for selecting the first to tenth upper normal memory cell regions UM10 to UM19 and UM10' of the second upper memory cell region group UMG1, if the upper redundancy operation signal UNXEB1 is disabled.

The longest path in the second circuit region 350 from the start of transmission of the second row address BXAR1 to completion of transmission of the lower redundancy operation signal DNXEB1 is as follows.

Figure 15:
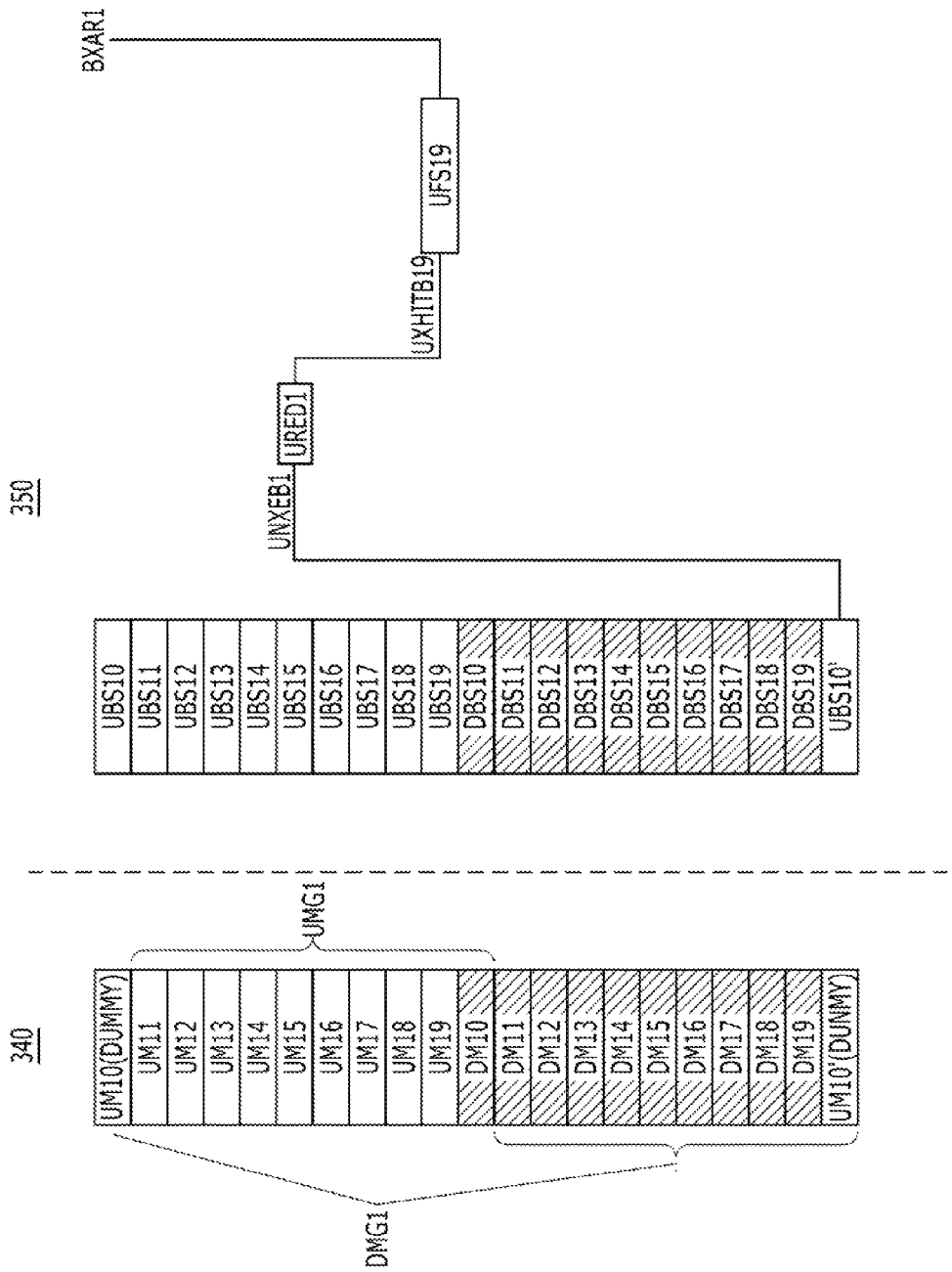
FIG. 15 is a block diagram illustrating the longest path in the second circuit region shown in FIG. 13.

FIG. 15 is a block diagram illustrating the longest path in the second circuit region 350 shown in FIG. 13.

Referring to FIG. 15, the longest path in the second circuit region 350 may correspond to where the second row address BXAR1 is identical to the pre-stored comparison address stored in the tenth upper comparison unit UFS10 and the eleventh upper memory cell region selection unit UBS19' is disabled according to the upper redundancy operation signal UNXEB1. In such case, the longest path in the second circuit region 350 may be sum of paths for transmission of the second row address BXAR1 (2K[μm]), the first lower redundancy free signal DXHITB10 (1K[μm]) and the lower redundancy operation signal DNXEB1 (3K[μm]), which corresponds to 6K[μm].

Enablement of the first to tenth lower memory cell region selection units DBS10 to DBS19 may depend on the lower redundancy operation signal DNXEB1.

For example, the first to tenth lower memory cell region selection units DBS10 to DBS19 may not select the first to tenth lower normal memory cell regions DM10 to DM19 of the second lower memory cell region group DMG1, regardless of any signal for selecting the first to tenth lower normal memory cell regions DM10 to DM19 of the second lower memory cell region group DMG1, if the lower redundancy operation signal DNXEB1 is enabled. Therefore, selection of a failed memory cell included in the second lower memory cell region group DMG1 may be prevented. On the other hand, the first to tenth lower memory cell region selection units DBS10 to DBS19 may select one or more of the first to tenth lower normal memory cell regions DM10 to DM19 of the second lower memory cell region group DMG1 according to a signal for selecting the first to tenth lower normal memory cell regions DM10 to DM19 of the second lower memory cell region group DMG1, if the lower redundancy operation signal DNXEB1 is disabled.

In accordance with an exemplary embodiment of the present invention, input and output paths of elements included in the first and second circuit regions 330 and 350 may be disposed symmetrically about the peripheral region 310 and, therefore, the semiconductor device may have the same longest path between the first and second circuit regions 330 and 350.

While the present invention has been described with respect to specific exemplary embodiments, it will be apparent to those skilled in the art that various changes and modifications may be made without departing from the spirit and scope of the invention as defined in the following claims.

What is claimed is:

1. A semiconductor device comprising:
   a first memory cell region including:
      a plurality of first normal memory cell regions,
      a first dummy memory cell region disposed at one side of the plurality of first normal memory cell regions, and
      a second dummy memory cell region disposed at another side of the plurality of first normal memory cell regions;
   a first circuit region including a first control circuit to control an operation of the plurality of first normal memory cell regions, the first dummy memory cell region, and the second dummy memory cell region, in response to a first source signal;
   a second memory cell region including:
      a plurality of second normal memory cell regions, a third dummy memory cell region disposed at the one side of the plurality of second normal memory cell regions, and a fourth dummy memory cell region disposed at the another side of the plurality of second normal memory cell regions; and a second circuit region including a second control circuit suitable for controlling operations of the plurality of second normal memory cell regions, the third dummy memory cell region, and the fourth dummy memory cell region, in response to a second source signal, wherein the first memory cell region and the second memory cell region are symmetrically disposed about a peripheral region of the semiconductor device and the first circuit region and second circuit regions are symmetrically disposed about the peripheral region of the semiconductor device, wherein a longest path in the first circuit region is same distance as a longest path in the second circuit region.

2. The semiconductor device of claim 1, wherein the peripheral region is configured to generate the first source signal and the second source signal, wherein the plurality of first normal memory cell regions and the plurality of second normal memory cell regions are symmetrically arranged about the peripheral region.

3. The semiconductor device of claim 2, wherein the first dummy memory cell region and the second dummy memory cell region serve as a first normal memory cell region according to a control of the first control circuit, and wherein the third dummy memory cell region and the fourth dummy memory cell region serve as a second normal memory cell region according to a control of the second control circuit.

4. The semiconductor device of claim 3, wherein a part of the plurality of first normal memory cell regions belong to a first upper memory cell region group, and a remaining part of the plurality of first normal memory cell regions, the first dummy memory cell region, and the second dummy memory cell region belong to a first lower memory cell region group, and the first lower memory cell region group is disposed closer to the peripheral region than the first upper memory cell region group.

5. The semiconductor device of claim 4, wherein the first control circuit comprises:

a plurality of first upper memory cell region selection units respectively corresponding to memory cell regions belonging to the first upper memory cell region group;

a first upper memory cell region control unit to control the plurality of first upper memory cell region selection units in response to the first source signal;

a plurality of first lower memory cell region selection units respectively corresponding to memory cell regions belonging to the first lower memory cell region group; and a first lower memory cell region control unit to control the plurality of first lower memory cell region selection units in response to the first source signal.

6. The semiconductor device of claim 5, wherein the first upper memory cell region control unit comprises:

a plurality of first upper comparison units, respectively corresponding to the plurality of first upper memory cell region selection units, to:
compare the first source signal to a pre-stored comparison signal, and
generate a plurality of first upper redundancy pre-signals; and a first upper repair unit to generate a first upper redundancy operation signal in response to the plurality of first upper redundancy pre-signals, wherein the plurality of first upper memory cell region selection units are disabled in response to the first upper redundancy operation signal.

7. The semiconductor device of claim 5, wherein the first lower memory cell region control unit comprises:

a plurality of first lower comparison units, respectively corresponding to the plurality of first lower memory cell region selection units, to:
compare the first source signal to a pre-stored comparison signal, and
generate a plurality of first lower redundancy pre-signals; and a first lower repair unit to generate a first lower redundancy operation signal in response to the plurality of first lower redundancy pre-signals, wherein the plurality of first lower memory cell region selection units are disabled in response to the first lower redundancy operation signal.

8. The semiconductor device of claim 3, wherein a part of the plurality of second normal memory cell regions belong to a second upper memory cell region group, a remaining part of the plurality of second normal memory cell regions, the third dummy memory cell region, and the fourth dummy memory cell region belong to a second lower memory cell region group, and the second lower memory cell region group is disposed closer to the peripheral region than the second upper memory cell region group.

9. The semiconductor device of claim 8, wherein the second control circuit comprises:

a plurality of second upper memory cell region selection units respectively corresponding to memory cell regions belonging to the second upper memory cell region group;

a second upper memory cell region control unit to control the plurality of second upper memory cell region selection units in response to the second source signal;

a plurality of second lower memory cell region selection units respectively corresponding to memory cell regions belonging to the second lower memory cell region group; and a second lower memory cell region control unit to control the plurality of second lower memory cell region selection units in response to the second source signal.

10. The semiconductor device of claim 9, wherein the second upper memory cell region control unit comprises:

a plurality of second upper comparison units, respectively corresponding to the plurality of second upper memory cell region selection units, to:
compare the second source signal to a pre-stored comparison signal, and
generate a plurality of second upper redundancy pre-signals; and a second upper repair unit to generate a second upper redundancy operation signal in response to the plurality of second upper redundancy pre-signals, wherein the plurality of second upper memory cell region selection units are disabled in response to the second upper redundancy operation signal.

11. The semiconductor device of claim 9, wherein the second lower memory cell region control unit comprises:

a plurality of second lower comparison units, respectively corresponding to the plurality of second lower memory cell region selection units, to:
compare the second source signal to a pre-stored comparison signal, and
generate a plurality of second lower redundancy pre-signals; and
a second lower repair unit to generate a second lower redundancy operation signal in response to the plurality of second lower redundancy pre-signals, wherein
the plurality of second lower memory cell region selection units are disabled in response to the second lower redundancy operation signal.

12. A semiconductor device comprising:
a first memory cell region including, in serial order:
a first dummy memory cell region,
a plurality of first normal memory cell regions, and
a second dummy memory cell region;
a first circuit region including:
a first dummy memory cell region selection unit to select the first dummy memory cell region,
a second dummy memory cell region selection unit to select the second dummy memory cell region, and
a first memory cell region control unit to prevent the first dummy memory cell region selection unit and the second dummy memory cell region selection unit from respectively selecting the first dummy memory cell region or the second dummy memory cell region in response to a first source signal;
a second memory cell region including, in serial order:
a third dummy memory cell region,
a plurality of second normal memory cell regions, and
a fourth dummy memory cell region; and
a second circuit region including:
a third dummy memory cell region selection unit to select the third dummy memory cell region, and
a fourth dummy memory cell region selection unit to select the fourth dummy memory cell region, and
a second memory cell region control unit to prevent the third dummy memory cell region selection unit and the fourth dummy memory cell region selection unit from respectively selecting the third dummy memory cell region or the fourth dummy memory cell region in response to a second source signal, wherein
an input path and an output path of the first memory cell region control unit and the second memory cell region control unit are symmetrically disposed about a peripheral region of the semiconductor device,
wherein a longest path in the first circuit region is same distance as a longest path in the second circuit region.

13. The semiconductor device of claim 12, wherein the peripheral region is configured to generate the first source signal and the second source signal.

14. The semiconductor device of claim 13, wherein, in the first memory cell region, the first dummy memory cell region, (N−1) numbers of first lower normal memory cell regions of the plurality of first normal memory cell regions, (N) numbers of first upper normal memory cell regions of the plurality of first normal memory cell regions, and the second dummy memory cell region are disposed in serial order about the peripheral region, and
in the second memory cell region, the third dummy memory cell region, (N−1) numbers of second upper normal memory cell regions of the plurality of second normal memory cell regions, (N) numbers of second lower normal memory cell regions of the plurality of second normal memory cell regions, and the fourth dummy memory cell region are disposed in serial order about the peripheral region.

15. The semiconductor device of claim 14, wherein the second memory cell region has an arrangement of memory cell regions that is shifted by one memory cell region, as compared to an arrangement of memory cell regions of the first memory cell region.

16. The semiconductor device of claim 14, wherein the first dummy memory cell region and the second dummy memory cell region serve as a first lower normal memory cell region according to a control of the first dummy memory cell region selection unit and the second dummy memory cell region selection unit, and
wherein the third dummy memory cell region and the fourth dummy memory cell region serve as a second upper normal memory cell region according to control of the third dummy memory cell region selection unit and the fourth dummy memory cell region selection unit.

17. The semiconductor device of claim 14, wherein the first circuit region comprises:
(N) number of first upper memory cell region selection units to select the (N) number of the first upper normal memory cell regions;
a third memory cell region control unit to prevent the (N) numbers of first upper memory cell region selection units from selecting the (N) numbers of the first upper normal memory cell regions in response to the first source signal; and
(N−1) numbers of first lower memory cell region selection units to select the (N−1) numbers of the first lower normal memory cell regions,
wherein the first memory cell region control unit prevents the (N−1) numbers of first lower memory cell region selection units from selecting the (N−1) numbers of the first lower normal memory cell regions in response to the first source signal.

18. The semiconductor device of claim 17, wherein the first dummy memory cell region selection unit, the (N−1) numbers of first lower memory cell region selection units, the (N) numbers of first upper memory cell region selection units, and the second dummy memory cell region selection unit are disposed in an order the same as the first dummy memory cell region, the (N−1) numbers of first lower normal memory cell regions, the (N) numbers of first upper normal memory cell regions, and the second dummy memory cell region.

19. The semiconductor device of claim 17, wherein the first memory cell region control unit comprises:
(N) numbers of first upper comparison units, respectively corresponding to the (N) numbers of first upper memory cell region selection units, to:
compare the first source signal to a pre-stored comparison signal, and
generate (N) numbers of first upper redundancy pre-signals; and
a first upper repair unit to generate a first upper redundancy operation signal in response to the (N) numbers of first upper redundancy pre-signals, wherein
the (N) numbers of first upper memory cell region selection units are disabled in response to the first upper redundancy operation signal.

20. The semiconductor device of claim 17, wherein the third memory cell region control unit comprises:
(N) numbers of first lower comparison units, respectively corresponding to the (N−1) numbers of first lower memory cell region selection units and the first dummy memory cell region selection unit, to:
compare the first source signal to a pre-stored comparison signal and
generate (N) numbers of first lower redundancy pre-signals; and
a first lower repair unit to generate a first lower redundancy operation signal in response to the (N) numbers of first lower redundancy pre-signals, wherein
the (N−1) numbers of first lower memory cell region selection units, the first dummy memory cell region selection unit, and the second dummy memory cell region selection unit are disabled in response to the first lower redundancy operation signal.

21. The semiconductor device of claim 14, wherein the second circuit region comprises:
(N−1) numbers of second upper memory cell region selection units to select the (N−1) numbers of the second upper normal memory cell regions;
(N) numbers of second lower memory cell region selection units to select the (N) numbers of the second lower normal memory cell regions; and
a fourth memory cell region control unit suitable to prevent the (N) numbers of second lower memory cell region selection units from selecting the (N) numbers of the second lower normal memory cell regions in response to the second source signal, and
wherein the second memory cell region control unit is to prevent the (N−1) numbers of second upper memory cell region selection units from selecting the (N−1) numbers of the second upper normal memory cell regions in response to the second source signal.

22. The semiconductor device of claim 21, wherein the third dummy memory cell region selection unit, the (N−1) numbers of second upper memory cell region selection units, the (N) numbers of second lower memory cell region selection units, and the fourth dummy memory cell region selection unit are disposed in a same order as the third dummy memory cell region, the (N−1) numbers of second upper normal memory cell regions, the (N) numbers of second lower normal memory cell regions, and the fourth dummy memory cell region.

23. The semiconductor device of claim 21, wherein the second memory cell region control unit comprises:
(N) numbers of second upper comparison units, respectively corresponding to the (N−1) numbers of second upper memory cell region selection units and the third dummy memory cell region selection unit, to:
compare the second source signal to a pre-stored comparison signal, and
generate (N) numbers of second upper redundancy pre-signals; and
a second upper repair unit to generate a second upper redundancy operation signal in response to the (N) numbers of second upper redundancy pre-signals, wherein
the (N−1) numbers of second upper memory cell region selection units, the third dummy memory cell region selection unit, and the fourth dummy memory cell region selection unit are disabled in response to the second upper redundancy operation signal.

24. The semiconductor device of claim 21, wherein the fourth memory cell region control unit comprises:
(N) numbers of second lower comparison units, respectively corresponding to the (N) numbers of second lower memory cell region selection units, to:
compare the second source signal to a pre-stored comparison signal, and
generate (N) numbers of second lower redundancy pre-signals; and
a second lower repair unit to generate a second lower redundancy operation signal in response to the (N) numbers of second lower redundancy pre-signals, wherein
the (N) numbers of second lower memory cell region selection units are disabled in response to the second lower redundancy operation signal.

* * * * *